US009379164B2

(12) United States Patent
Nakai et al.

(10) Patent No.: US 9,379,164 B2
(45) Date of Patent: Jun. 28, 2016

(54) INTEGRATED CIRCUIT DEVICE

(71) Applicant: KABUSHIKI KAISHA TOSHIBA, Minato-ku, Tokyo (JP)

(72) Inventors: Tsukasa Nakai, Yokkaichi Mie (JP); Masaki Kondo, Yokkaichi Mie (JP); Hikari Tajima, Koganei Tokyo (JP); Hiroki Tokuhira, Kawasaki Kanagawa (JP); Takashi Izumida, Yokohama Kanagawa (JP); Takashi Kurusu, Yamato Kanagawa (JP); Nobutoshi Aoki, Yokohama Kanagawa (JP); Takahisa Kanemura, Yokohama Kanagawa (JP); Tadayoshi Uechi, Kawasaki Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/631,176

(22) Filed: Feb. 25, 2015

(65) Prior Publication Data
US 2015/0255514 A1 Sep. 10, 2015

Related U.S. Application Data

(60) Provisional application No. 61/949,029, filed on Mar. 6, 2014.

(51) Int. Cl.
*H01L 27/24* (2006.01)
*H01L 45/00* (2006.01)
(Continued)

(52) U.S. Cl.
CPC ........ *H01L 27/2481* (2013.01); *G11C 11/1655* (2013.01); *G11C 11/1659* (2013.01); *G11C 11/1673* (2013.01); *G11C 11/1675* (2013.01);
(Continued)

(58) Field of Classification Search
CPC .................. H01L 27/2481; H01L 45/1226
USPC ................................... 257/331, 332
See application file for complete search history.

(56) References Cited

U.S. PATENT DOCUMENTS

| 5,181,088 A * | 1/1993 | Mikata | ............. H01L 29/78642 257/331 |
| 5,955,765 A * | 9/1999 | Yamazaki | ......... H01L 29/42384 257/347 |

(Continued)

OTHER PUBLICATIONS

U.S. Appl. No. 14/631,236, filed Feb. 25, 2015, First Named Inventor: Tsukasa Nakai, Title: "Integrated Circuit Device".

*Primary Examiner* — Earl Taylor
(74) *Attorney, Agent, or Firm* — Holtz, Holtz & Volek PC

(57) ABSTRACT

An integrated circuit device according to an embodiment includes a semiconductor substrate, a first semiconductor member and a second semiconductor member provided on the semiconductor substrate, a first electrode disposed between the first semiconductor member and the second semiconductor member, and a second electrode disposed between the semiconductor substrate and the first electrode. The first semiconductor member and the second semiconductor member extend in a first direction perpendicular to an upper surface of the semiconductor substrate. The first semiconductor member and the second semiconductor member are separated in a second direction orthogonal to the first direction. The first electrode extends in a third direction intersecting both the first direction and the second direction. The second electrode extends in the third direction.

23 Claims, 32 Drawing Sheets

(51) Int. Cl.
- *G11C 11/16* (2006.01)
- *G11C 13/00* (2006.01)
- *H01L 23/528* (2006.01)
- *H01L 27/22* (2006.01)
- *H01L 43/02* (2006.01)
- *H01L 43/08* (2006.01)
- *G11C 7/12* (2006.01)
- *G11C 8/14* (2006.01)

(52) U.S. Cl.
CPC ............ *G11C 13/003* (2013.01); *G11C 13/004* (2013.01); *G11C 13/0026* (2013.01); *G11C 13/0069* (2013.01); *H01L 23/528* (2013.01); *H01L 27/228* (2013.01); *H01L 27/2436* (2013.01); *H01L 43/02* (2013.01); *H01L 43/08* (2013.01); *H01L 45/1226* (2013.01); *H01L 45/1253* (2013.01); *H01L 45/145* (2013.01); *H01L 45/146* (2013.01); *G11C 7/12* (2013.01); *G11C 8/14* (2013.01); *G11C 13/0004* (2013.01); *G11C 13/0007* (2013.01); *G11C 2013/005* (2013.01); *G11C 2013/009* (2013.01); *G11C 2213/71* (2013.01); *G11C 2213/78* (2013.01); *G11C 2213/79* (2013.01)

(56) References Cited

U.S. PATENT DOCUMENTS

| | | | | |
|---|---|---|---|---|
| 6,982,194 B2 | * | 1/2006 | Tsunoda | H01L 27/1214 257/E21.412 |
| 8,378,415 B2 | * | 2/2013 | Higashino | H01L 29/66666 257/329 |
| 2002/0011612 A1 | * | 1/2002 | Hieda | H01L 21/823814 257/262 |
| 2004/0018690 A1 | * | 1/2004 | Muraoka | H01L 21/28167 438/300 |
| 2005/0017319 A1 | * | 1/2005 | Manabe | H01L 21/28185 257/498 |
| 2005/0184327 A1 | * | 8/2005 | Ozawa | H01L 27/115 257/302 |
| 2008/0142838 A1 | * | 6/2008 | Ohta | H01L 21/190 |
| 2008/0261357 A1 | * | 10/2008 | Kameshiro | H01L 29/66613 438/164 |
| 2009/0230458 A1 | * | 9/2009 | Ishiduki | H01L 27/11565 257/324 |
| 2009/0246932 A1 | * | 10/2009 | Kamioka | H01L 21/76208 438/421 |
| 2012/0025874 A1 | * | 2/2012 | Saikaku | H01L 29/1095 327/109 |
| 2012/0299090 A1 | * | 11/2012 | Kim | H01L 27/10873 257/331 |
| 2013/0187118 A1 | * | 7/2013 | Murooka | H01L 45/04 257/4 |
| 2014/0367762 A1 | * | 12/2014 | Tian | H01L 29/66825 257/321 |
| 2015/0255514 A1 | * | 9/2015 | Nakai | H01L 27/2481 257/4 |
| 2015/0270312 A1 | * | 9/2015 | Tajima | H01L 27/249 257/5 |

* cited by examiner

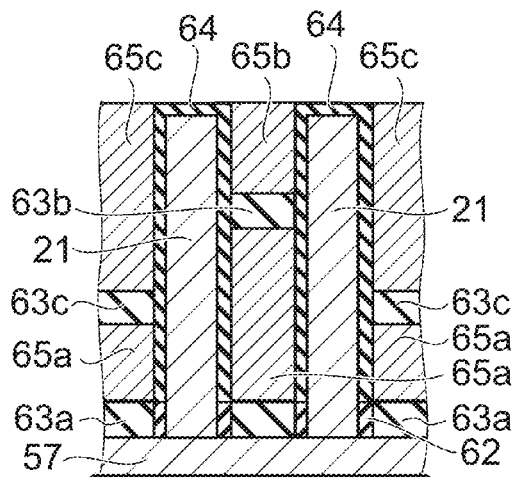
FIG. 17A
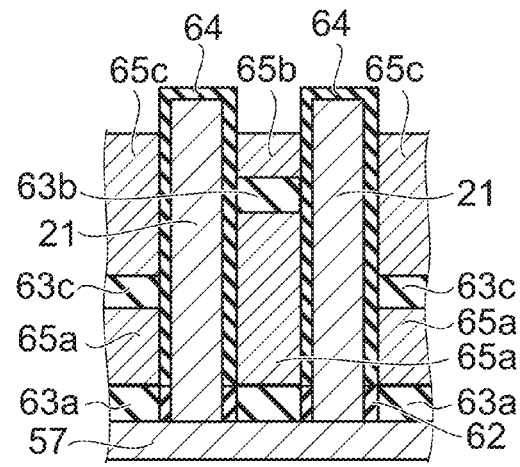
FIG. 17B
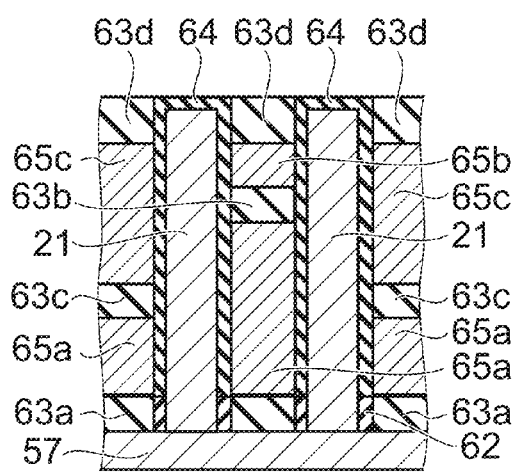
FIG. 17C
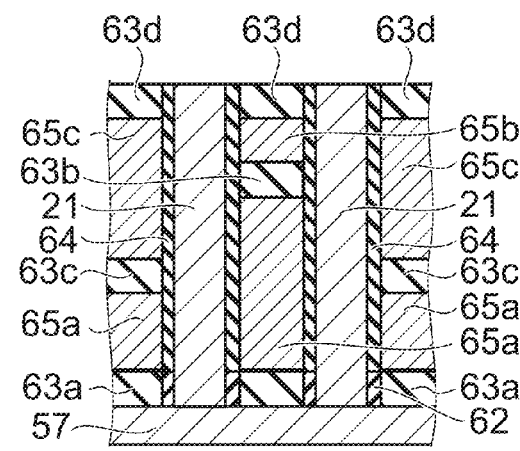
FIG. 17D
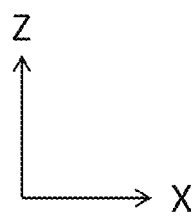

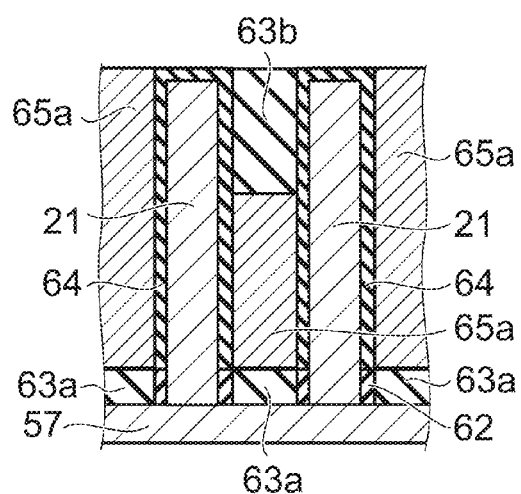
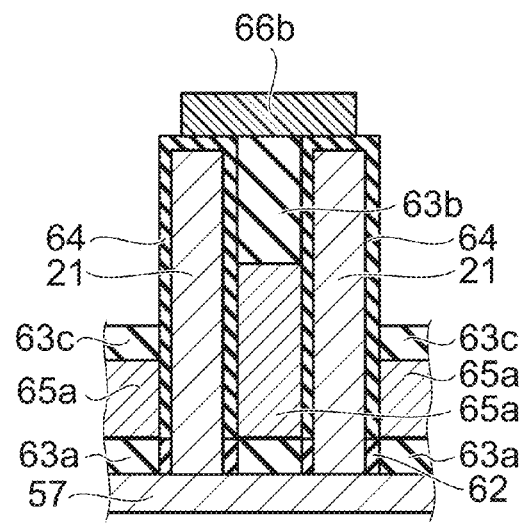
FIG. 19A  FIG. 19B
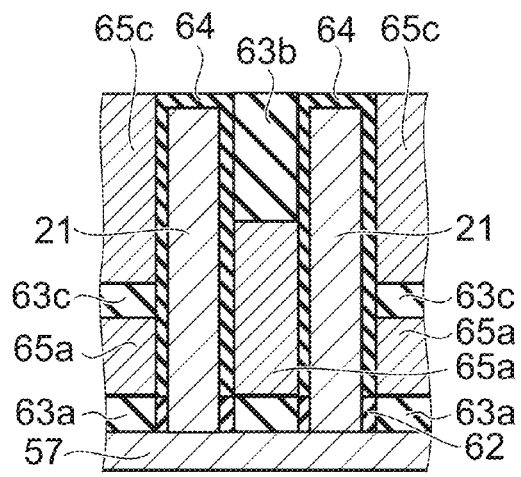
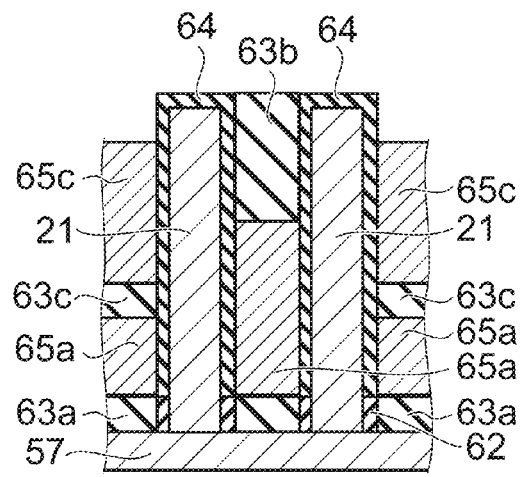
FIG. 19C  FIG. 19D

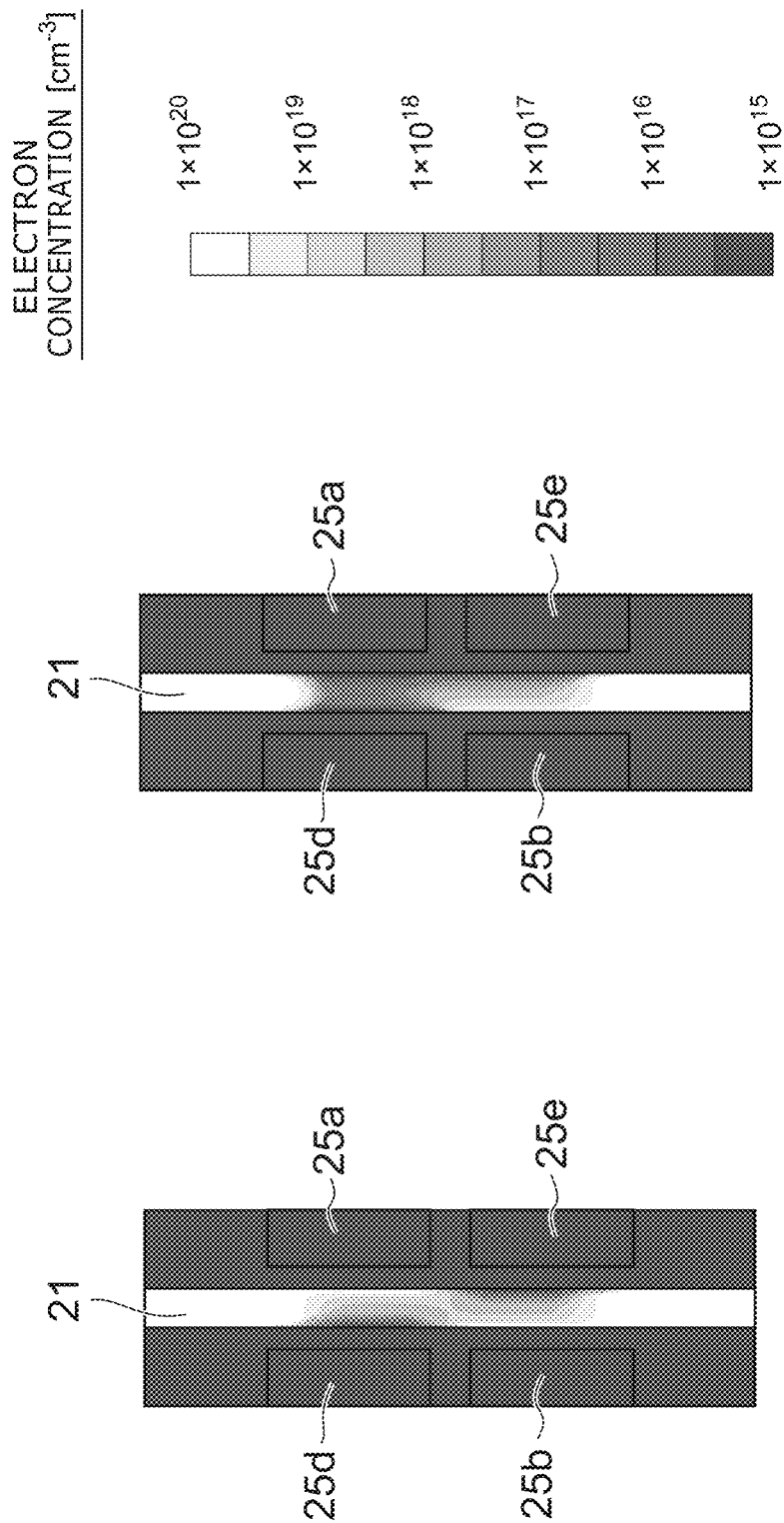

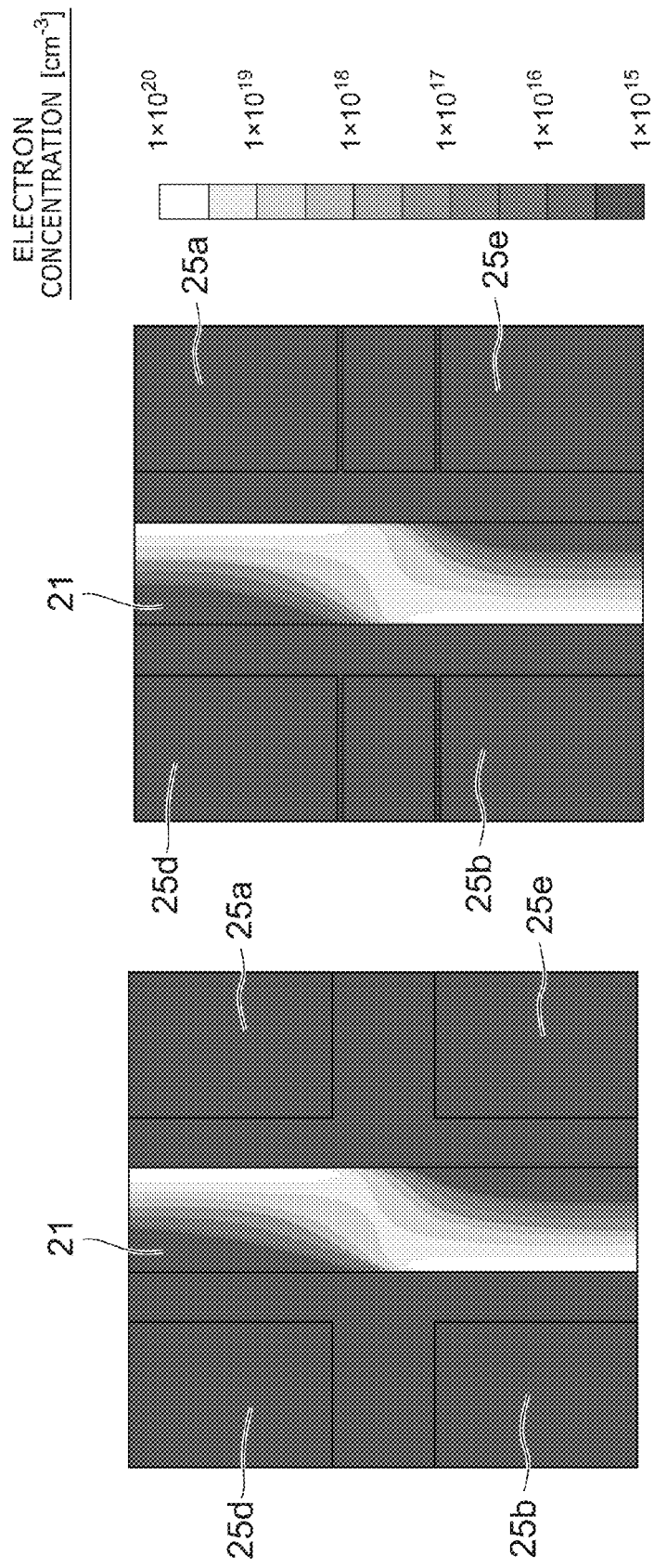
FIG. 35A EXAMPLE OF FIRST EMBODIMENT
FIG. 35B EXAMPLE OF ELEVENTH EMBODIMENT

INTEGRATED CIRCUIT DEVICE

CROSS-REFERENCE TO RELATED APPLICATIONS

This application is based upon and claims the benefit of priority from U.S. Provisional Patent Application 61/949,029, filed on Mar. 6, 2014; the entire contents of which are incorporated herein by reference.

FIELD

Embodiments described herein relate generally to an integrated circuit device.

BACKGROUND

In recent years, a memory device has been proposed in which memory cells are integrated two-dimensionally or three-dimensionally. In such a memory device, the memory cells for which the programming or reading of data is performed are selected by selecting one interconnect of multiple interconnects provided parallel to each other. The selection of the interconnect can be performed by connecting a TFT (Thin Film Transistor) to the interconnect and by switching the TFT ON/OFF.

BRIEF DESCRIPTION OF THE DRAWINGS

FIG. 15A to FIG. 17D are cross-sectional views showing a method for manufacturing the integrated circuit device according to the sixth embodiment;

FIG. 19A to FIG. 20B are cross-sectional views showing a method for manufacturing the integrated circuit device according to the modification of the sixth embodiment;

FIG. 34A and FIG. 34B are examples of graphs of the electron concentration inside the semiconductor member; FIG. 34A shows "selected" and FIG. 34B shows "half-selected"; and FIG. 35A and FIG. 35B are examples of graphs of the electron concentration inside the semiconductor member in the ON state; FIG. 35A shows the example of the first embodiment; and FIG. 35B shows the example of the eleventh embodiment.

DETAILED DESCRIPTION

An integrated circuit device according to an embodiment includes a semiconductor substrate, a first semiconductor member and a second semiconductor member provided on the semiconductor substrate, a first electrode disposed between the first semiconductor member and the second semiconductor member, and a second electrode disposed between the semiconductor substrate and the first electrode. The first semiconductor member and the second semiconductor member extend in a first direction perpendicular to an upper surface of the semiconductor substrate. The first semiconductor member and the second semiconductor member are separated in a second direction orthogonal to the first direction. The first electrode extends in a third direction intersecting both the first direction and the second direction. The second electrode extends in the third direction.

Various embodiments will be described hereinafter with reference to the accompanying drawings.

First Embodiment

First, a first embodiment will be described.

Figure 1:
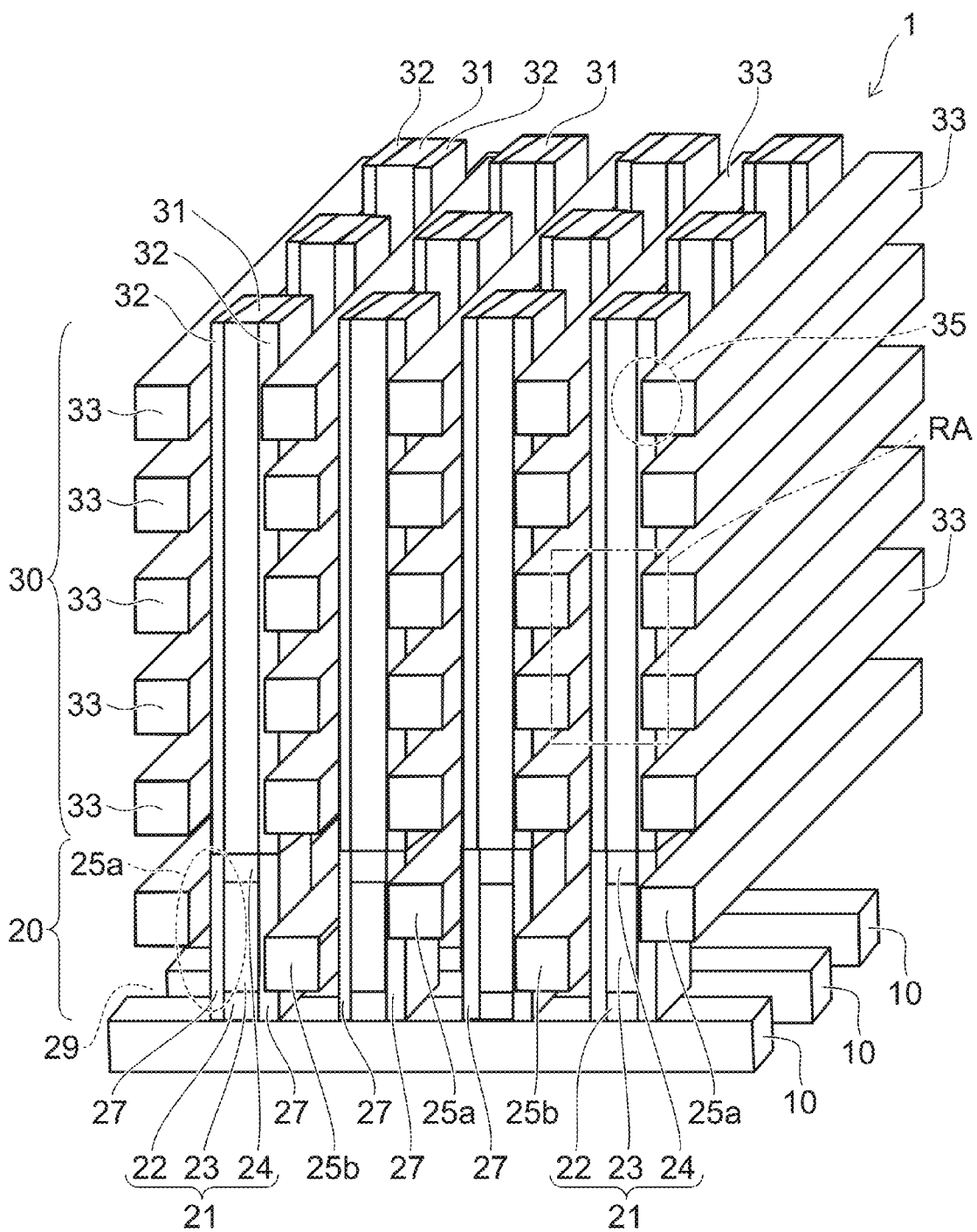
FIG. 1 is a perspective view showing an integrated circuit device according to a first embodiment.

FIG. 1 is a perspective view showing an integrated circuit device according to the embodiment.

Figure 2:
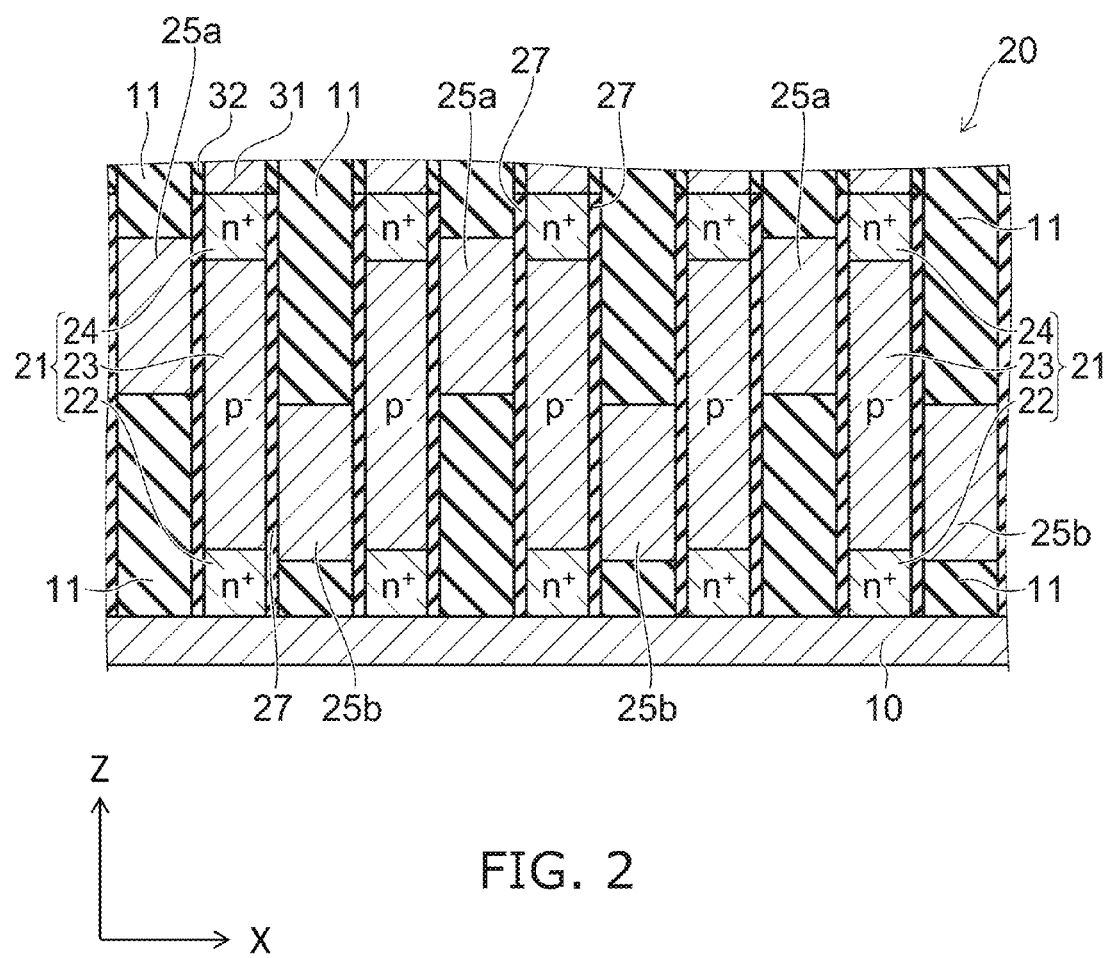
FIG. 2 is a cross-sectional view showing an interconnect selection unit of the integrated circuit device shown in FIG. 1.

FIG. 2 is a cross-sectional view showing an interconnect selection unit of the integrated circuit device shown in FIG. 1.

Figure 3:
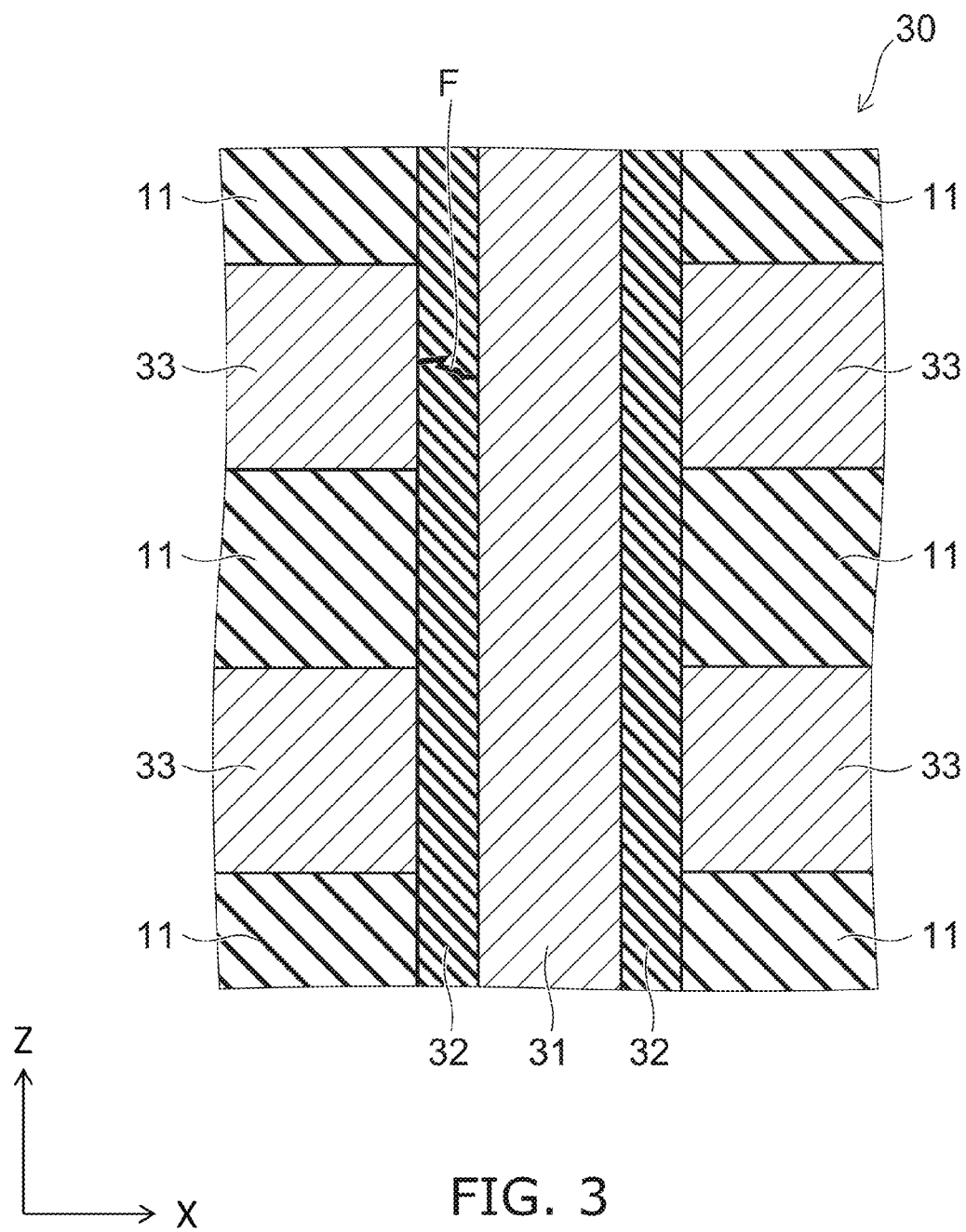
FIG. 3 is a cross-sectional view showing a memory unit of region RA of the integrated circuit device shown in FIG. 1.

FIG. 3 is a cross-sectional view showing the memory unit of region RA of the integrated circuit device shown in FIG. 1.

The integrated circuit device according to the embodiment is ReRAM (Resistance Random Access Memory).

For convenience of description hereinbelow, an XYZ orthogonal coordinate system is employed in the specification.

As shown in FIG. 1, multiple global bit lines 10 that extend in the X-direction are provided in the integrated circuit device 1 according to the embodiment. The multiple global bit lines 10 are arranged periodically along the Y-direction. The global bit lines 10 are formed of, for example, the upper layer portion of a silicon substrate partitioned by an element-separating insulator (not shown) or are formed of polysilicon on an insulating film (not shown) provided on a silicon substrate (not shown).

Interconnect selection units 20 are provided on the global bit lines 10; and a memory unit 30 is provided on the interconnect selection units 20.

As shown in FIG. 1 and FIG. 2, multiple semiconductor members 21 are provided in the interconnect selection units 20. The multiple semiconductor members 21 are arranged in a matrix configuration along the X-direction and the Y-direction; and each of the semiconductor members 21 extends in the Z-direction. Also, the multiple semiconductor members 21 that are arranged in one column along the X-direction have a common connection with one global bit line 10. In each of the semiconductor members 21, an $n^+$-type portion 22, a $p^-$-type portion 23, and an $n^+$-type portion 24 are arranged in this order along the Z-direction from the lower side, i.e., the global bit line 10 side. The relationship between the n-type and the p-type may be reversed.

The $n^+$-type portions 22 and 24 are formed of, for example, silicon into which an impurity that forms donors is introduced. The $p^-$-type portion 23 is formed of, for example, silicon into which an impurity that forms acceptors is introduced. The effective impurity concentration of the $p^-$-type portion 23 is lower than the effective impurity concentrations of the $n^+$-type portions 22 and 24. The effective impurity concentration refers to the concentration of the impurities contributing to the conduction of the semiconductor material and, for example, in the case where both an impurity that forms donors and an impurity that forms acceptors are contained in the semiconductor material, refers to the portion of the concentration excluding the cancelled portion of the donors and the acceptors. The boundary between the $n^+$-type portion 22 and the $p^-$-type portion 23 and the boundary between the $p^-$-type portion 23 and the $n^+$-type portion 24 are the positions where the high/low relationship of the concentration reverses when measuring the concentration profiles of the impurity that forms donors and the impurity that forms acceptors in the semiconductor member 21 along the Z-direction.

Gate electrodes 25a and gate electrodes 25b that extend in the Y-direction are provided alternately between the semiconductor members 21 in the X-direction. In the Z-direction, the gate electrodes 25a are at the same position; and the gate electrodes 25b are at the same position. Here, the gate electrodes 25a are at a position that is higher than the gate electrodes 25b, that is, a position that is more distal to the global bit lines 10. The gate electrodes 25a and 25b are formed of, for example, polysilicon.

In the Z-direction, the lengths of the gate electrodes 25a and 25b are equal; and the lengths of the gate electrodes 25a and 25b are shorter than the length of the $p^-$-type portion 23. Therefore, as viewed from the X-direction, the gate electrode 25a overlaps the upper portion of the $p^-$-type portion 23 and the lower portion of the $n^+$-type portion 24 but does not overlap the $n^+$-type portion 22; and the gate electrode 25b overlaps the upper portion of the $n^+$-type portion 22 and the lower portion of the $p^-$-type portion 23 but does not overlap the $n^+$-type portion 24.

In other words, when assuming the first and second semiconductor members 21 adjacent to each other in the X-direction, the first gate electrode 25b that is disposed on the side opposite to the second semiconductor member 21 in the X-direction as viewed from the first semiconductor member 21 overlaps the $n^+$-type portion 22 and the $p^-$-type portion 23 but does not overlap the $n^+$-type portion 24 as viewed from the X-direction. Also, the second gate electrode 25a that is disposed between the first and second semiconductor members 21 overlaps the $p^-$-type portion 23 and the $n^+$-type portion 24 but does not overlap the $n^+$-type portion 22 as viewed from the X-direction. Also, the third gate electrode 25b that is disposed on the side opposite to the first semiconductor member 21 in the X-direction as viewed from the second semiconductor member 21 overlaps the $n^+$-type portion 22 and the $p^-$-type portion 23 but does not overlap the $n^+$-type portion 24 as viewed from the X-direction.

A gate insulator film 27 made of, for example, silicon oxide is provided between the semiconductor member 21 and the gate electrode 25a and between the semiconductor member 21 and the gate electrode 25b. For example, an n-channel TFT 29 is formed of the gate electrode 25a or 25b, the gate insulator film 27, and the semiconductor member 21 including the $n^+$-type portion 22, the $p^-$-type portion 23, and the $n^+$-type portion 24.

As shown in FIG. 1 and FIG. 3, multiple local bit lines 31 are provided in the memory unit 30. The multiple local bit lines 31 are arranged in a matrix configuration along the X-direction and the Y-direction; and each of the local bit lines 31 extends in the Z-direction. Also, the lower ends of the local bit lines 31 are connected to the upper ends of the semiconductor members 21. The local bit lines 31 are formed of, for example, polysilicon.

A variable resistance film 32 that is used as the memory elements is provided on the two side surfaces of each of the local bit lines 31 facing the two X-direction sides. The variable resistance film 32 is made of, for example, a metal oxide; and when, for example, a voltage not less than a constant is applied, the state is switched to a low resistance state by a filament F being formed in the interior of the variable resistance film 32; and when a voltage having the reverse polarity is applied, the state is switched to a high resistance state by the filament F being broken.

Multiple local word lines 33 are provided between the variable resistance films 32 between the local bit lines 31 adjacent to each other in the X-direction. The multiple local word lines 33 are arranged in a matrix configuration along the X-direction and the Z-direction; and each of the local word lines 33 extends in the Y-direction. Also, the local word lines 33 contact the variable resistance films 32. In particular, the multiple local word lines 33 arranged in one column along the Z-direction contact common variable resistance films 32. Each of the local word lines 33 contacts two variable resistance films 32 on the two X-direction sides.

Further, a memory cell 35 is formed of one local bit line 31, one local word line 33, and one portion of the variable resistance film 32 interposed between the one local bit line 31 and the one local word line 33. Accordingly, multiple memory cells 35 are connected in series to one TFT 29. In the entire memory unit 30, the multiple memory cells 35 are arranged in a three-dimensional matrix configuration along the X-direction, the Y-direction, and the Z-direction.

Also, in the integrated circuit device 1, an inter-layer insulating film 11 is provided to bury the global bit lines 10, the semiconductor members 21, the gate electrodes 25a and 25b, the gate insulator films 27, the local bit lines 31, the variable resistance films 32, and the local word lines 33.

A method for manufacturing the integrated circuit device according to the embodiment will now be described with focus on the method for manufacturing the interconnect selection unit.

FIG. 4A to FIG. 6C are cross-sectional views showing the method for manufacturing the interconnect selection unit of the integrated circuit device according to the embodiment.

Figure 4A:
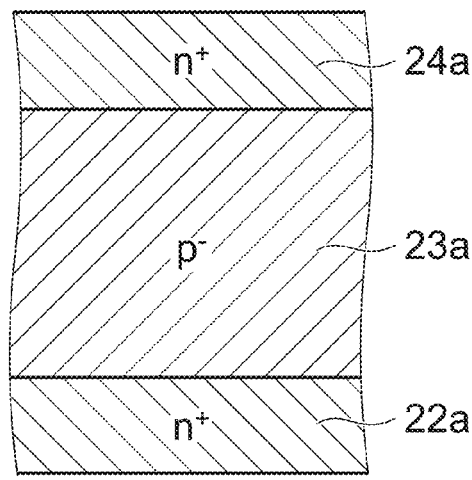
FIG. 4A to FIG. 6C are cross-sectional views showing a method for manufacturing the interconnect selection unit of the integrated circuit device according to the first embodiment.

First, as shown in FIG. 4A, an n$^+$-type silicon layer 22a, a p$^-$-type silicon layer 23a, and an n$^+$-type silicon layer 24a are stacked in this order on an interconnect layer including the multiple global bit lines 10 (referring to FIG. 1 and FIG. 2).

Figure 4B:
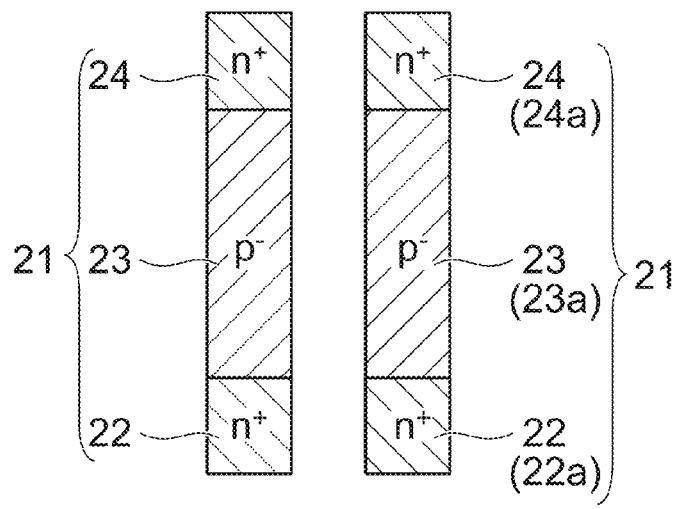

Then, as shown in FIG. 4B, the stacked film made of the n$^+$-type silicon layer 22a, the p$^-$-type silicon layer 23a, and the n$^+$-type silicon layer 24a is patterned into, for example, columnar configurations extending in the Z-direction by dividing the stacked film into a matrix configuration along the X-direction and the Y-direction. Thereby, the multiple semiconductor members 21 are formed. At this time, the divided n$^+$-type silicon layer 22a becomes the n$^+$-type portions 22; the divided p$^-$-type silicon layer 23a becomes the p$^-$-type portions 23; and the divided n$^+$-type silicon layer 24a becomes the n$^+$-type portions 24.

Figure 4C:
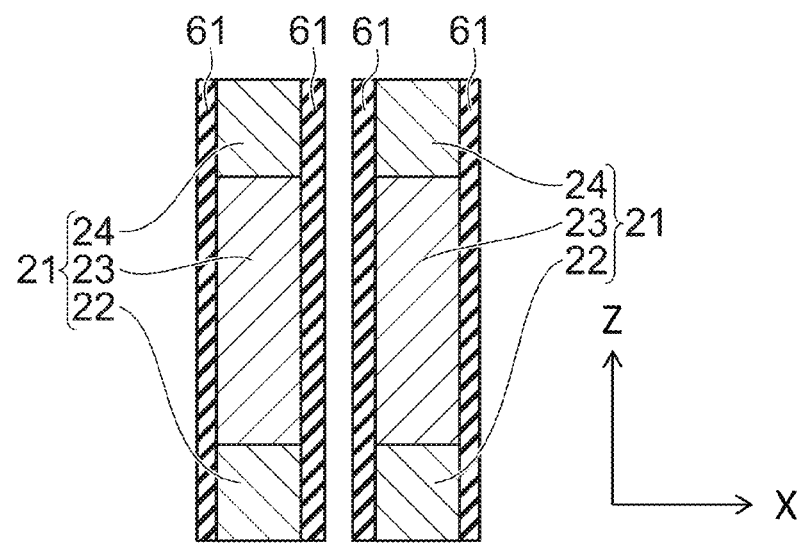

Then, as shown in FIG. 4C, liner films 61 are formed on the side surfaces of the semiconductor members 21 by, for example, depositing silicon nitride (SiN) by ALD (Atomic Layer Deposition) and by subsequently performing etch-back.

Figure 5A:
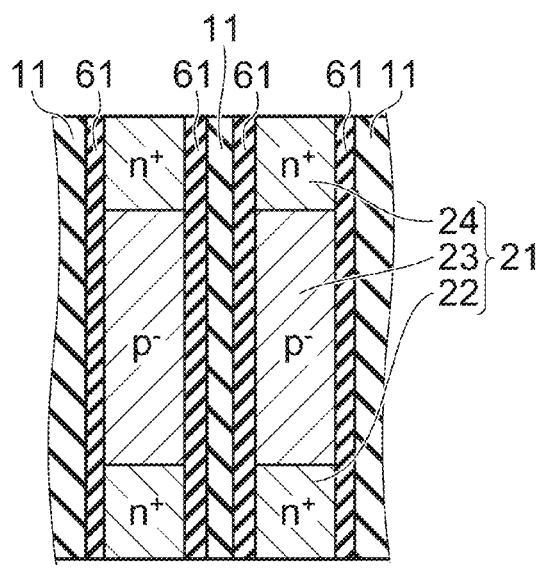

Then, as shown in FIG. 5A, for example, the inter-layer insulating film 11 that includes silicon oxide ($SiO_2$) is formed to bury the semiconductor members 21 and the liner films 61 by coating using PSZ (Polysilazane) (hereinbelow, called the "PSZ method").

Figure 5B:
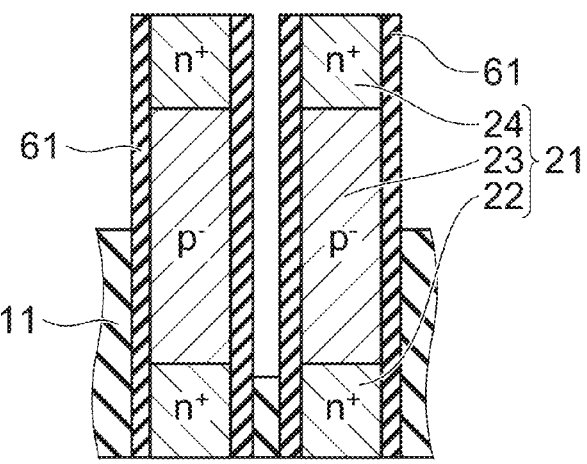

Then, as shown in FIG. 5B, the upper surface of the inter-layer insulating film 11 is caused to recede to a position at the Z-direction central portion vicinity of the p$^-$-type portion 23 by etching the inter-layer insulating film 11. Then, for the portions of the inter-layer insulating film 11 disposed in every other space between the semiconductor members 21 in the X-direction, the upper surface of the inter-layer insulating film 11 is caused to recede to a position slightly lower than the interface between the n$^+$-type portion 22 and the p$^-$-type portion 23 by further etching. Thereby, a portion of the liner films 61 is exposed.

Figure 5C:
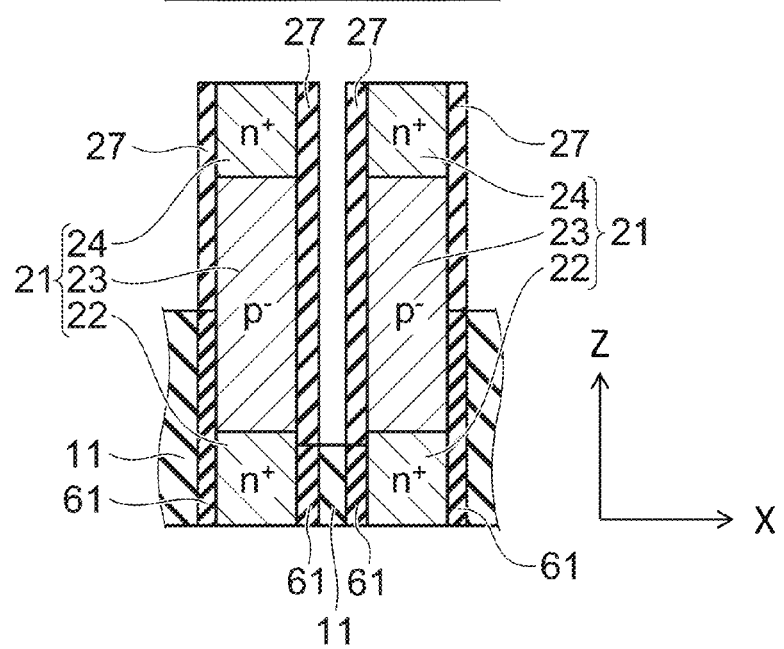

Then, as shown in FIG. 5C, the exposed portion of the liner films 61 is removed. Thereby, a portion of the semiconductor members 21 is exposed. Then, for example, the gate insulator films 27 made of silicon oxide are formed on the exposed surfaces of the semiconductor members 21 by performing thermal oxidation treatment.

Figure 6A:
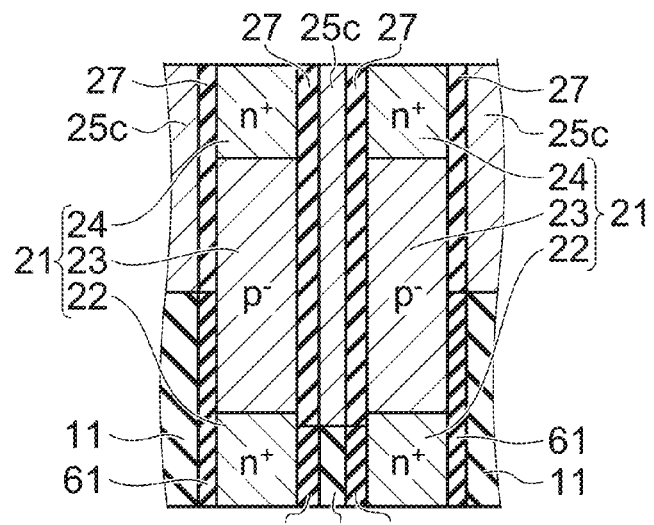

Then, as shown in FIG. 6A, a conductive film 25c made of a conductive material such as, for example, polysilicon, etc., buries the portions of the semiconductor members 21 and the gate insulator films 27 protruding from the inter-layer insulating film 11.

Figure 6B:
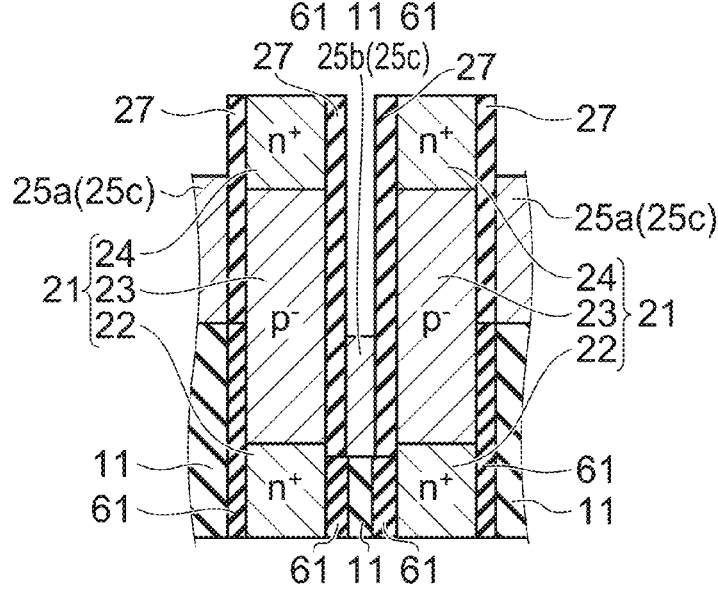

Then, as shown in FIG. 6B, the upper surface of the conductive film 25c is caused to recede to a position slightly higher than the interface between the p$^-$-type portion 23 and the n$^+$-type portion 24 by etching the conductive film 25c. Then, for the spaces between the semiconductor members 21 in the X-direction where the upper surface of the inter-layer insulating film 11 is caused to recede to the position slightly lower than the interface between the n$^+$-type portion 22 and the p$^-$-type portion 23, the upper surface of the conductive film 25c is caused to recede to a position at the Z-direction central portion vicinity of the p$^-$-type portion 23 by further etching the conductive film 25c. Thereby, for the conductive film 25c remaining between the semiconductor members 21 in the X-direction, the remaining portions that are relatively high become the gate electrodes 25a; and the remaining portions that are relatively low become the gate electrodes 25b.

Figure 6C:
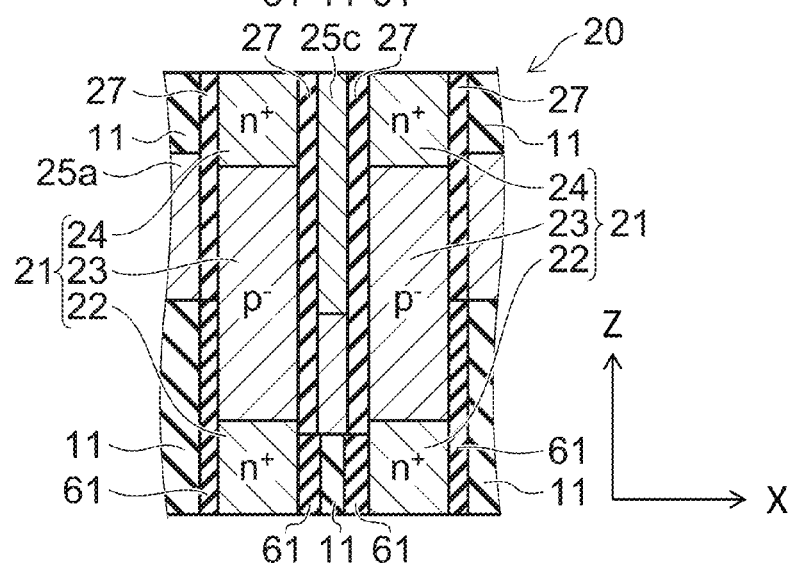

Then, as shown in FIG. 6C, the inter-layer insulating film 11 is filled into the space where the conductive film 25c is removed by the etching. Thus, the interconnect selection units 20 are formed such that the gate electrodes 25a and 25b are disposed in a staggered configuration.

Then, as shown in FIG. 1 and FIG. 3, the memory unit 30 is formed on the interconnect selection units 20. Thereby, the integrated circuit device 1 according to the embodiment is manufactured.

The operations and the effects of the embodiment will now be described.

Figure 7:
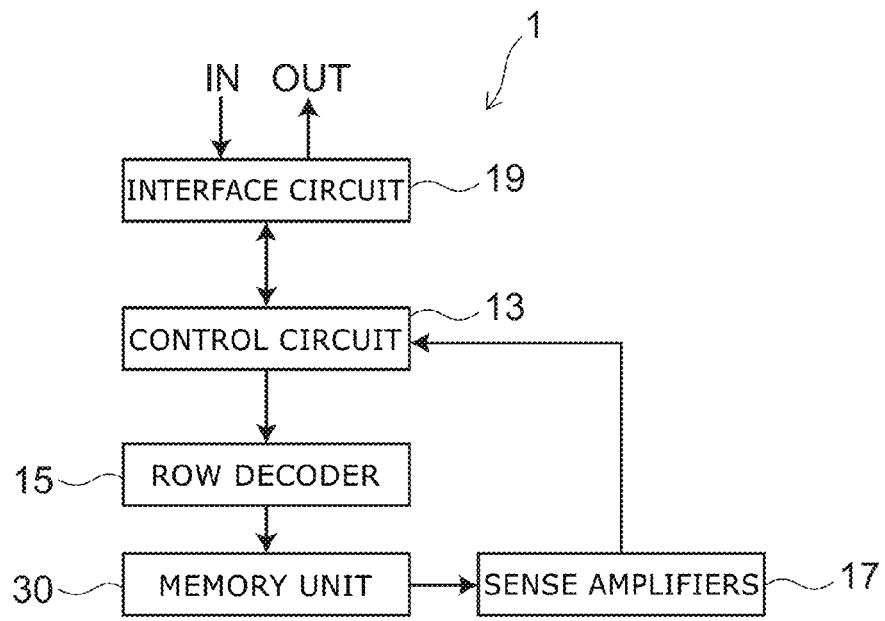
FIG. 7 is an example of a block diagram showing the integrated circuit device according to the first embodiment.

FIG. 7 is an example of a block diagram showing the integrated circuit device according to the embodiment.

As shown in FIG. 7, the integrated circuit device 1 includes, for example, a row decoder 15 that drives the local word lines 33 disposed in the memory unit 30, and sense amplifiers 17 that are connected to the global bit lines 10. The sense amplifiers 17 discriminate the data read from the memory cells 35 and can temporarily store the data. Also, the integrated circuit device 1 includes a control circuit 13 and an interface circuit 19. The control circuit 13 programs information to the memory cells 35 or reads information from the memory cells 35 via the row decoder 15 and the sense amplifiers 17 based on instructions input from the outside via the interface circuit 19.

For example, the control circuit 13 selects one of the multiple global bit lines 10 via the sense amplifier 17. Also, the control circuit 13 controls the semiconductor members 21 to select one of the multiple local bit lines 31 provided on the selected global bit line 10. Specifically, the local bit line 31 to be selected and the selected global bit line 10 are electrically connected by applying an ON potential to the gate electrode 25 of the semiconductor member 21 provided between the local bit line 31 to be selected and the selected global bit line 10 to switch the semiconductor member 21 ON. The details of this operation are described below.

Also, by designating one of the multiple local word lines 33, the control circuit 13 selects one of the multiple memory cells 35 provided between the selected local bit line 31 and the local word line 33.

For example, in the case where the information recorded in the memory cell 35 is read, the control circuit 13 applies a prescribed read-out voltage between the selected local word line 33 and the selected global bit line 10 and senses the current flowing in the selected global bit line 10 by the sense amplifier 17. Then, the information that is recorded in the memory cell 35 is designated based on the output from the sense amplifier 17; and the information is output via the interface circuit 19. Also, in the case where information is programmed to the memory cell 35, or in the case where information that is recorded in the memory cell is erased, the memory cell is caused to transition from a first state to a second state or reversely by applying a prescribed programming, reading, or erasing voltage between the selected local word line 33 and the selected global bit line 10.

Figure 8:
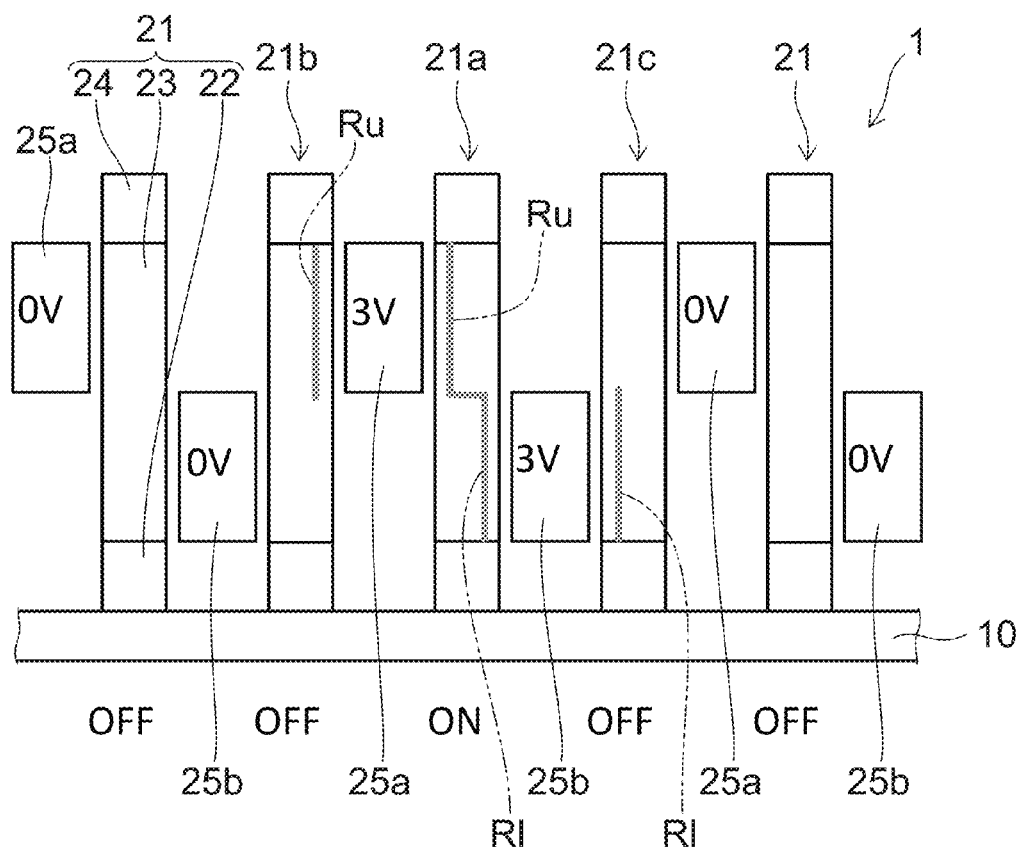
FIG. 8 is a schematic cross-sectional view showing operations and effects of the integrated circuit device according to the first embodiment.

FIG. 8 is a schematic cross-sectional view showing the operations and the effects of the integrated circuit device according to the embodiment.

The operation of the control circuit 13 selecting the semiconductor member 21 will now be described in detail.

In the integrated circuit device 1 according to the embodiment as shown in FIG. 8, the case is described where one semiconductor member 21 is to be switched to the ON state, and the other semiconductor members 21 are to be switched to the OFF state. Hereinbelow, the semiconductor member 21 to be switched to the ON state is called a "selected member 21a." Also, the semiconductor members 21 that are among the semiconductor members 21 to be switched to the OFF state and are disposed to be adjacent to the selected member 21a on two sides are called a "half-selected member 21b" and a "half-selected member 21c"; and the other semiconductor members 21 are called the "unselected members."

In such a case, the control circuit 13 applies an ON potential (e.g., 3 V) to the gate electrode 25a and the gate electrode 25b disposed on the two sides of the selected member 21a and applies an OFF potential (e.g., 0 V) to the other gate electrodes 25a and gate electrodes 25b. Thereby, in the upper portion of the p⁻-type portion 23 of the selected member 21a, an inversion layer Ru is formed in the portion on the gate electrode 25a side by the effect of the gate electrode 25a; and in the lower portion of the p⁻-type portion 23, an inversion layer Rl is formed in the portion on the gate electrode 25b side by the effect of the gate electrode 25b. If the selected member 21a is sufficiently fine, the inversion layer Ru of the upper portion and the inversion layer Rl of the lower portion are connected to each other; and a continuous current path is formed inside the p⁻-type portion 23. As a result, the selected member 21a is switched to the ON state.

Conversely, for half-selected member 21b that is positioned such that the gate electrode 25a is interposed as viewed from the selected member 21a, the inversion layer Ru is formed in the upper portion of the p⁻-type portion 23 because the upper portion of the p⁻-type portion 23 opposes the gate electrode 25a to which the ON potential (e.g., 3 V) is applied; but the inversion layer is not formed in the lower portion of the p⁻-type portion 23 because the lower portion of the p⁻-type portion 23 opposes the gate electrode 25b to which the OFF potential (e.g., 0 V) is applied. Therefore, half-selected member 21b as an entirety is in the OFF state.

Also, for the half-selected member 21c that is positioned such that the gate electrode 25b is interposed as viewed from the selected member 21a, the inversion layer Rl is formed in the lower portion of the p⁻-type portion 23 because the lower portion of the p⁻-type portion 23 opposes the gate electrode 25b to which the ON potential is applied; but the inversion layer is not formed in the upper portion of the p⁻-type portion 23 because the upper portion of the p⁻-type portion 23 opposes the gate electrode 25a to which the OFF potential is applied. Therefore, the half-selected member 21c as an entirety is in the OFF state.

Further, for the unselected members 21 other than the half-selected member 21b and 21c, the inversion layer is not formed in the p⁻-type portion 23 and the state is the OFF state because the OFF potential (e.g., 0 V) is applied to the gate electrodes 25a and 25b disposed on the two sides of the unselected members 21.

Thus, according to the embodiment, by disposing the gate electrodes 25a and 25b arranged along the X-direction in a zigzag configuration displaced to oscillate along the Z-direction, for the half-selected member 21b and 21c adjacent to the selected member 21a on two sides, an inversion layer that continuously links the n⁺-type portion 22 and the n⁺-type portion 24 can be prevented from forming; and the half-selected member 21b and 21c can be reliably set to the OFF state. As a result, the ratio between the ON current and the OFF current in the semiconductor member 21 can be high; and the operations of the integrated circuit device are stabilized. Also, because it is sufficient for one selected from gate electrodes 25a and 25b to be provided between the semiconductor members 21, higher integration is easy. In other words, according to the embodiment, an integrated circuit device having high integration and stable operations can be realized.

Second Embodiment

A second embodiment will now be described.

Figure 9:
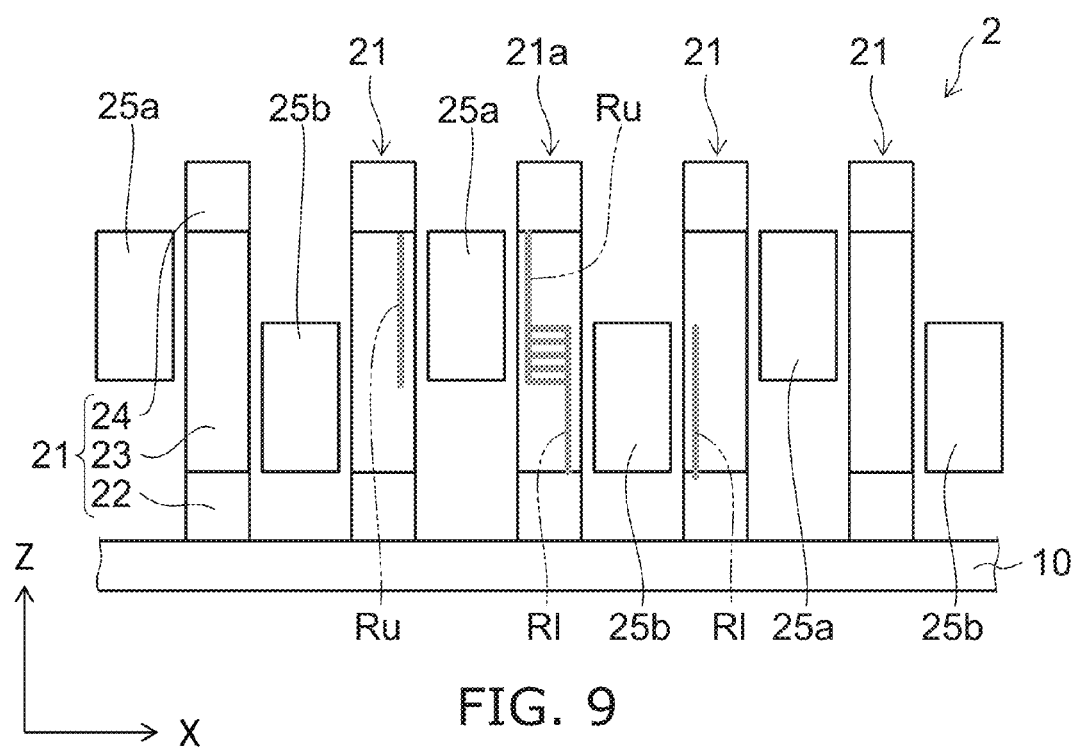
FIG. 9 is a schematic cross-sectional view showing an interconnect selection unit of an integrated circuit device according to a second embodiment.

FIG. 9 is a schematic cross-sectional view showing the interconnect selection unit of the integrated circuit device according to the embodiment.

As shown in FIG. 9, the integrated circuit device 2 according to the embodiment differs from the integrated circuit device 1 (referring to FIG. 1 to FIG. 3) according to the first embodiment described above in that the lower portion of the gate electrode 25a and the upper portion of the gate electrode 25b overlap as viewed from the X-direction.

The integrated circuit device 2 according to the embodiment can be manufactured by adjusting the etching amount of the inter-layer insulating film 11 in the process shown in FIG. 5B and by adjusting the etching amount of the conductive film 25c in the process shown in FIG. 6B.

In the embodiment, because the lower portion of the gate electrode 25a and the upper portion of the gate electrode 25b overlap as viewed from the X-direction, the formation regions of the inversion layers Ru and Rl in the selected member 21a overlap each other in the Z-direction. As a result, the coupling between the inversion layer Ru and the inversion layer Rl becomes stronger; and the ON current flowing in the selected member 21a can be increased even more.

Otherwise, the configuration, the operations, and the effects of the embodiment are similar to those of the first embodiment described above.

Third Embodiment

A third embodiment will now be described.

Figure 10:
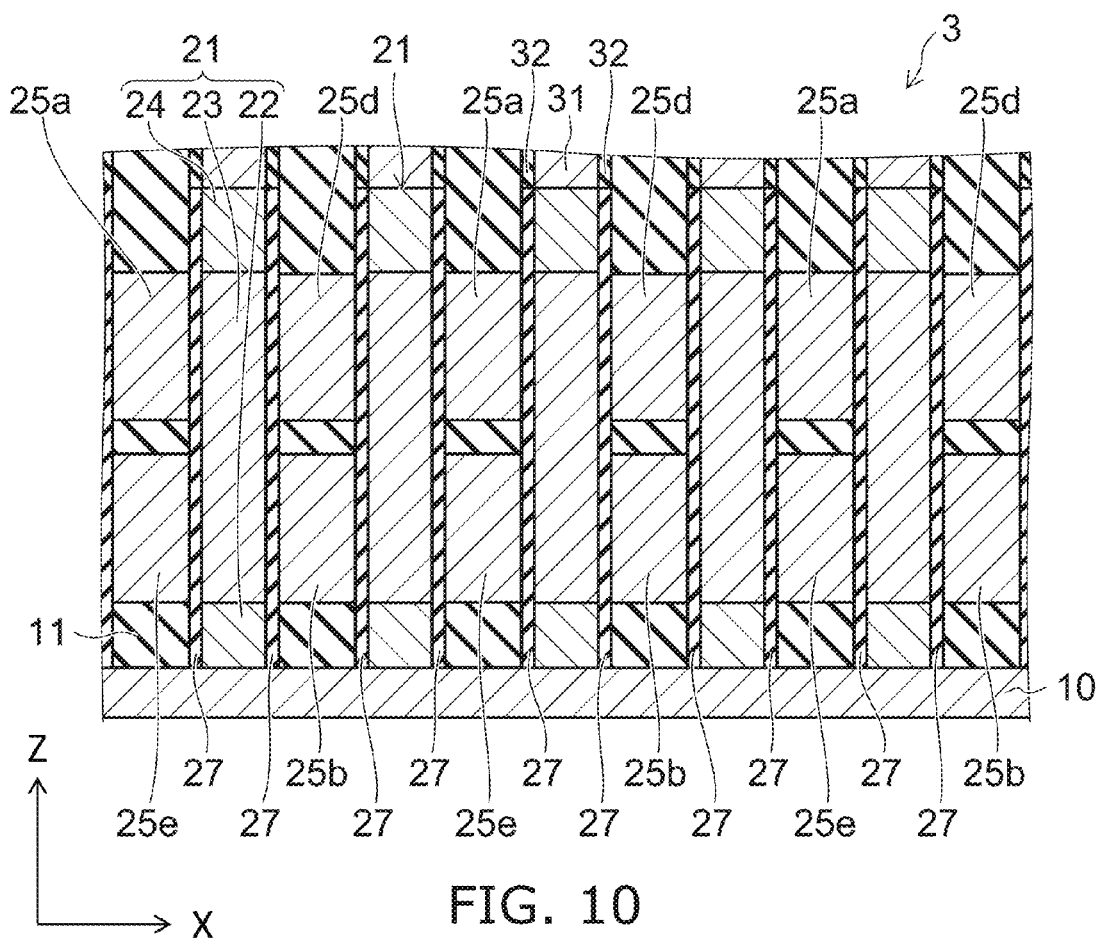
FIG. 10 is a cross-sectional view showing an interconnect selection unit of an integrated circuit device according to a third embodiment.

FIG. 10 is a cross-sectional view showing the interconnect selection unit of the integrated circuit device according to the embodiment.

As shown in FIG. 10, in addition to the configuration of the integrated circuit device 1 (referring to FIG. 1 to FIG. 3)

according to the first embodiment described above, dummy electrodes 25d and 25e are provided in the integrated circuit device 3 according to the embodiment. The dummy electrodes 25d and 25e are disposed at positions to supplement the zigzag arrangement of the gate electrodes 25a and 25b oscillating in the Z-direction. In other words, the dummy electrode 25d is disposed at the same position as the gate electrode 25b as viewed from the Z-direction and is disposed at the same position as the gate electrode 25a as viewed from the X-direction. Also, the dummy electrode 25e is disposed at the same position as the gate electrode 25a as viewed from the Z-direction and is disposed at the same position as the gate electrode 25b as viewed from the X-direction. Also, the gate insulator film 27 is provided between the semiconductor members 21 and the dummy electrodes 25d and between the semiconductor members 21 and the dummy electrodes 25e. Hereinbelow, the gate electrodes 25a and 25b and the dummy electrodes 25d and 25e also are generally called the "gate electrode 25." This is similar for the other embodiments described below as well.

A method for manufacturing the integrated circuit device according to the embodiment will now be described.

Figure 11A:
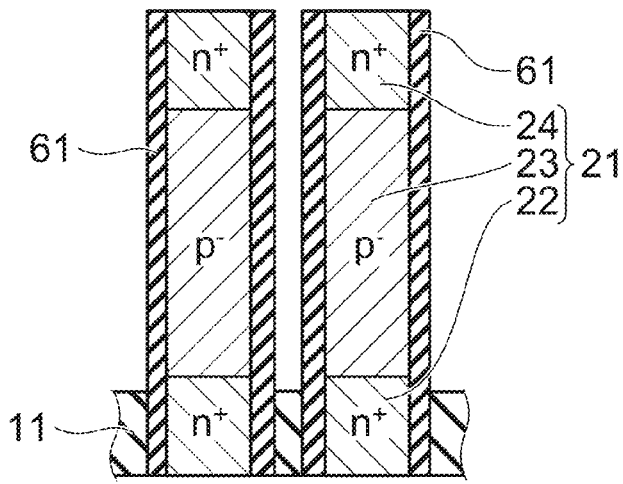
FIGS. 11A to 11C are cross-sectional views showing a method for manufacturing the integrated circuit device according to the third embodiment.
Figure 11B:
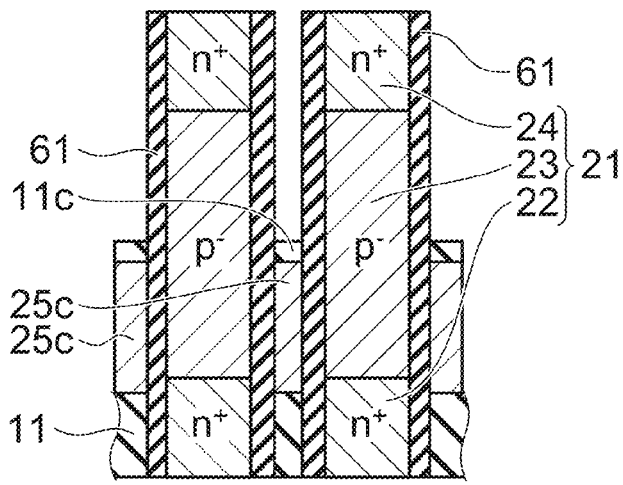
Figure 11C:
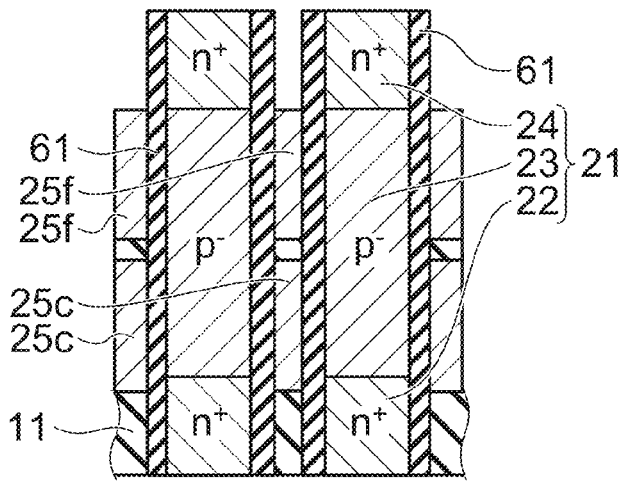

FIGS. 11A to 11C are cross-sectional views showing the method for manufacturing the integrated circuit device according to the embodiment.

First, the processes shown in FIG. 4A to FIG. 5A are implemented.

Then, as shown in FIG. 11A, the upper surface of the inter-layer insulating film 11 is caused to recede to a position slightly lower than the interface between the $n^+$-type portion 22 and the $p^-$-type portion 23 by performing etch-back of the inter-layer insulating film 11.

Then, as shown in FIG. 11B, the gap after the inter-layer insulating film 11 is removed is filled with the conductive film 25c made of a conductive material such as, for example, polysilicon, etc. Then, the upper surface of the conductive film 25c is caused to recede to a position slightly lower than the Z-direction center of the $p^-$-type portion 23 by performing etching of the conductive film 25c. Then, an inter-layer insulating film 11c is deposited; and the upper surface of the inter-layer insulating film 11c is caused to recede to a position slightly higher than the Z-direction center of the $p^-$-type portion 23 by performing etch-back.

Then, as shown in FIG. 11C, a conductive film 25f is deposited; and the upper surface of the conductive film 25f is caused to recede to a position at the vicinity of the interface between the $n^+$-type portion 24 and the $p^-$-type portion 23 by performing etch-back. Thus, the integrated circuit device 3 according to the embodiment is manufactured.

In the embodiment, similarly to the first embodiment described above, one of the semiconductor members 21 is switched to the ON state by selecting the potentials of the gate electrodes 25a and 25b; and the other semiconductor members 21 are switched to the OFF state. At this time, the dummy electrodes 25d and 25e are in floating states or have a constant potential, for example, a potential between the ON potential and the OFF potential.

According to the embodiment, by disposing the dummy electrodes 25d and 25e to supplement the zigzag arrangement of the gate electrodes 25a and 25b, the gate electrode 25b and the dummy electrode 25e can be formed simultaneously; and the gate electrode 25a and the dummy electrode 25d can be formed simultaneously. As a result, compared to the first embodiment described above, the number of processes for forming the interconnect selection units 20 can be reduced.

Otherwise, the configuration, the operations, and the effects of the embodiment are similar to those of the first embodiment described above.

Fourth Embodiment

A fourth embodiment will now be described.

Figure 12:
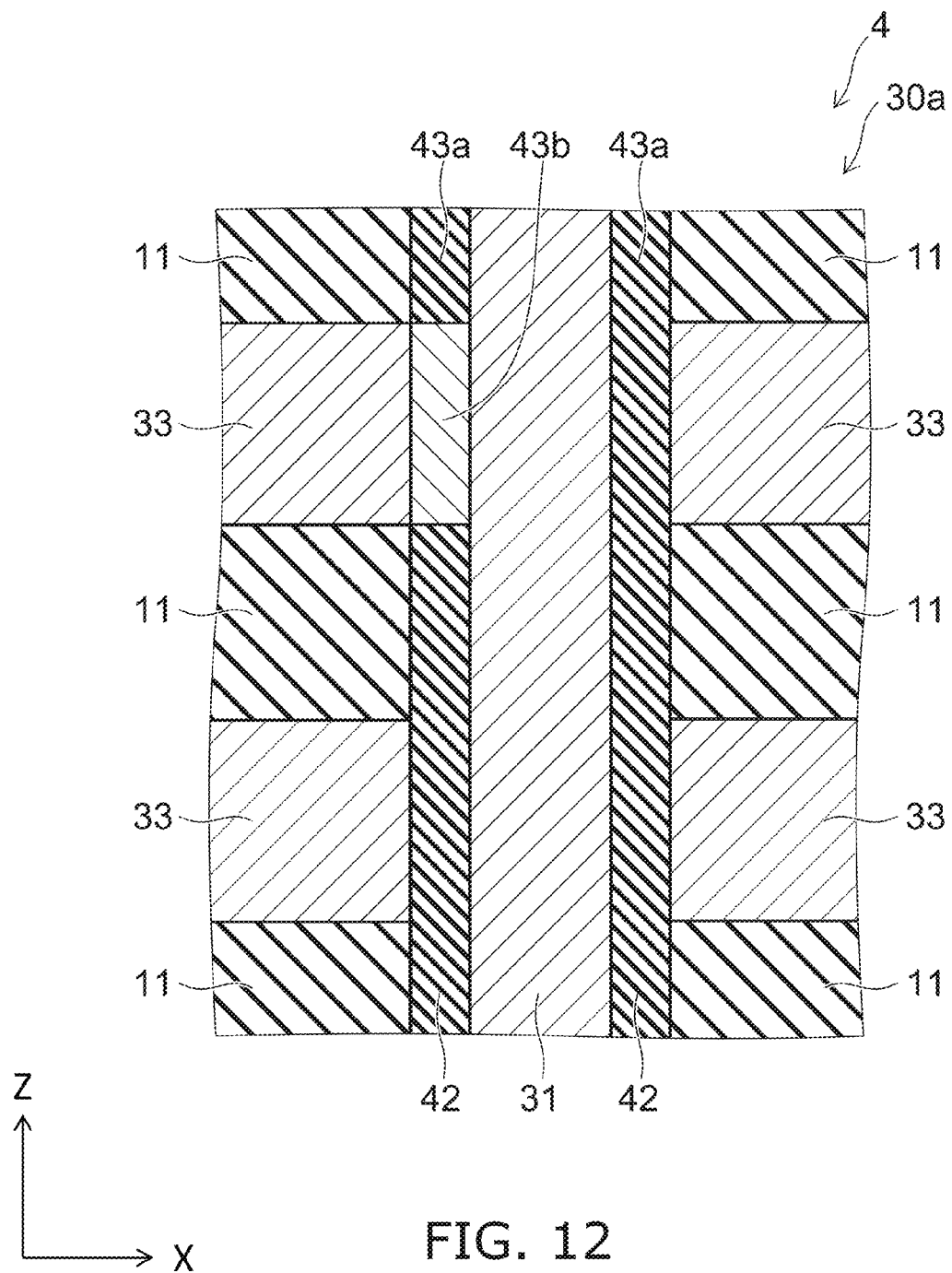
FIG. 12 is a cross-sectional view showing a memory unit of an integrated circuit device according to a forth embodiment.

FIG. 12 is a cross-sectional view showing the memory unit of the integrated circuit device according to the embodiment.

FIG. 12 is a cross-sectional view corresponding to region RA of FIG. 1.

As shown in FIG. 12, the integrated circuit device 4 according to the embodiment differs from the integrated circuit device 1 (referring to FIG. 1 to FIG. 3) according to the first embodiment described above in that the integrated circuit device 4 is PRAM (Phase Random Access Memory).

Namely, in a memory unit 30a of the integrated circuit device 4, a phase change film 42 is provided as the memory elements on the two side surfaces of each of the local bit lines 31 facing the two X-direction sides. The phase change film 42 is a film in which the crystalline phase changes between a phase 43a and a phase 43b according to the voltage or current that is applied; and when the crystalline phase changes, the electrical resistance value of that portion changes. Then, the memory cell is formed of one local bit line 31, one local word line 33, and one portion of the phase change film 42 interposed between the one local bit line 31 and the one local word line 33.

Otherwise, the configuration, the manufacturing method, the operations, and the effects of the embodiment are similar to those of the first embodiment described above.

Fifth Embodiment

A fifth embodiment will now be described.

Figure 13:
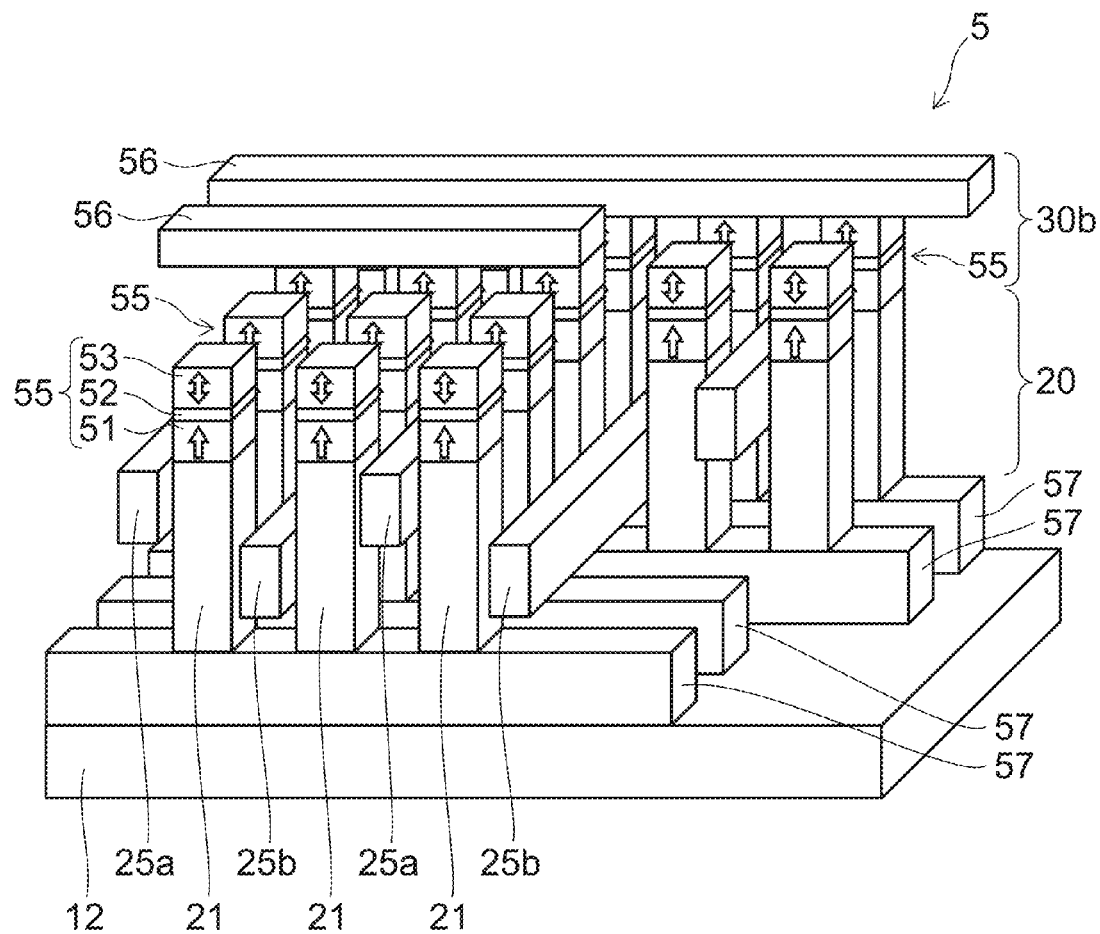
FIG. 13 is a perspective view showing an integrated circuit device according to a fifth embodiment.

FIG. 13 is a perspective view showing an integrated circuit device according to the embodiment.

As shown in FIG. 13, the integrated circuit device 5 according to the embodiment is MRAM (Magneto resistive Random Access Memory).

The multiple local source lines 57 are provided in the integrated circuit device 5 by patterning the upper layer portion of a monocrystalline silicon substrate 12. The multiple local source lines 57 are arranged periodically along the Y-direction; and each of the local source lines 57 extends in the X-direction. Similarly to normal element separation, the local source lines 57 are electrically isolated from each other by STI (Shallow Trench Isolation), a burying insulation film, an impurity concentration profile, etc. The multiple local source lines 57 may be combined into one. Similar to the first embodiment described above, the interconnect selection units 20 are provided on the interconnect layer including the multiple local source lines 57. In the embodiment, the channels of the interconnect selection units 20 are formed of monocrystalline silicon because the channels are formed by directly patterning the silicon substrate 12. Therefore, compared to the case where the channels are formed of polysilicon, the ON current can be increased.

Also, in the integrated circuit device 5, a memory unit 30b is provided on the interconnect selection units 20. In the memory unit 30b, a MTJ (Magnetic Tunnel Junction) element 55 is provided as a memory element on each of the semiconductor members 21. The MTJ element 55 is one type of magnetoresistive element. In the MTJ element 55, a fixed layer 51 made of a perpendicular magnetization film that is connected to the semiconductor member 21 and has a fixed magnetization direction, an insulating layer 52, and a memory layer 53 made of a perpendicular magnetization film that has a variable magnetization direction are stacked in this order from the lower side. Local bit lines 56 that extend in the X-direction are provided on the MTJ elements 55. The local bit lines 56 are disposed in the regions directly above the local source lines 57. The local bit line 56 has a common connection with the memory layers 53 of the multiple MTJ elements 55 arranged in one column along the X-direction.

Otherwise, the configuration, the manufacturing method, the operations, and the effects of the embodiment are similar to those of the first embodiment described above.

Sixth Embodiment

A sixth embodiment will now be described.

Figure 14:
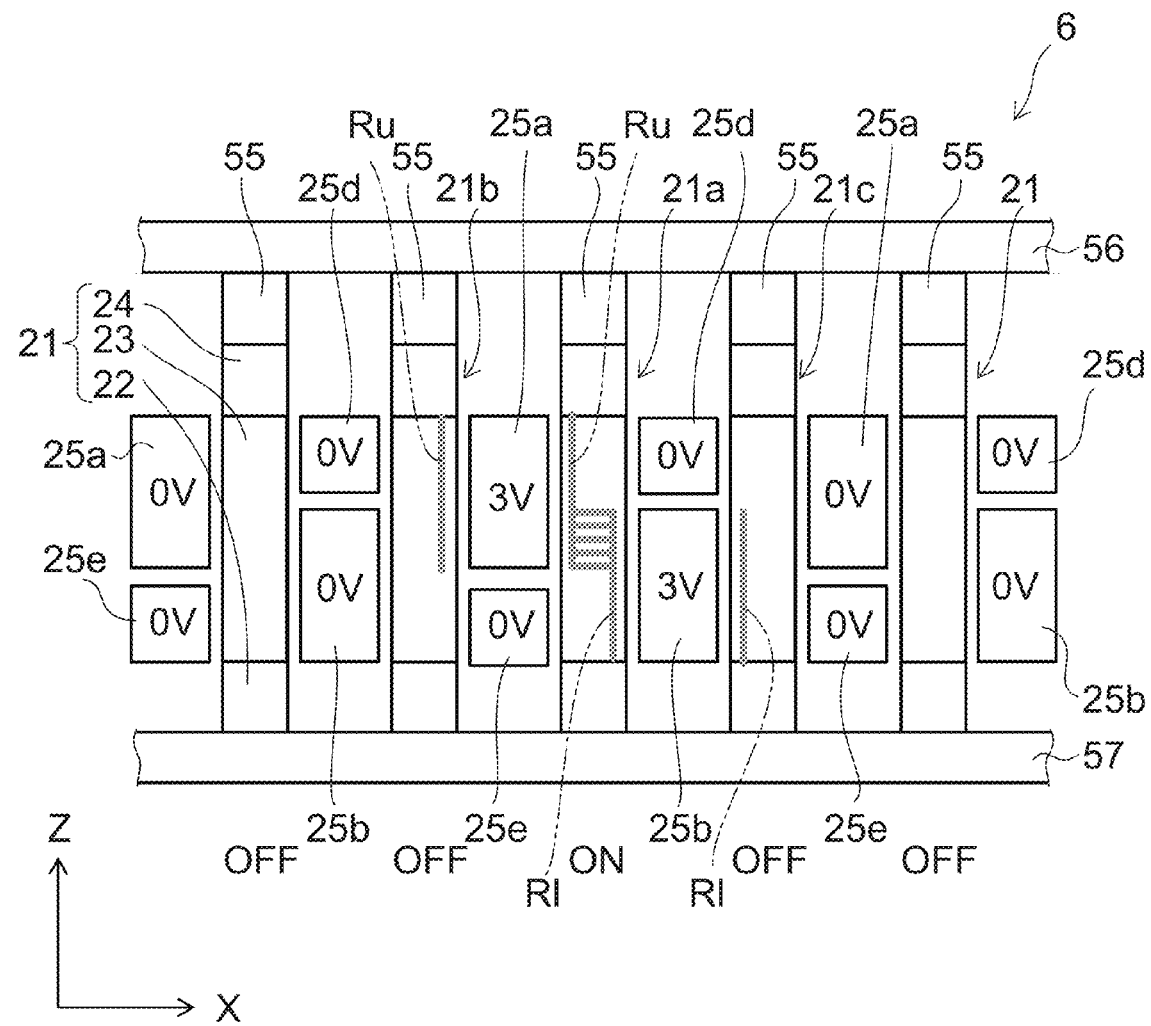
FIG. 14 is a schematic cross-sectional view showing an integrated circuit device according to a sixth embodiment.

FIG. 14 is a schematic cross-sectional view showing the integrated circuit device according to the embodiment.

The embodiment is an example in which the second embodiment (referring to FIG. 9), the third embodiment (referring to FIG. 10), and the fifth embodiment (referring to FIG. 13) that are described above are combined.

Namely, as shown in FIG. 14, the integrated circuit device 6 according to the embodiment is MRAM. Also, the integrated circuit device 6 differs from the integrated circuit device 3 according to the third embodiment described above (referring to FIG. 10) in that the gate electrodes 25a and 25b are longer than the dummy electrodes 25d and 25e in the Z-direction. When viewed from the X-direction, the lower portion of the gate electrode 25a overlaps the upper portion of the gate electrode 25b; but the dummy electrode 25d and the dummy electrode 25e are separated from each other. The ON potential (e.g., 3 V) or the OFF potential (e.g., 0 V) is applied to the gate electrodes 25a and 25b. Also, a constant potential, for example, the OFF potential (0 V) is applied to the dummy electrodes 25d and 25e.

A method for manufacturing the integrated circuit device according to the embodiment will now be described.

FIG. 15A to FIG. 17D are cross-sectional views showing the method for manufacturing the integrated circuit device according to the embodiment.

Figure 15A:
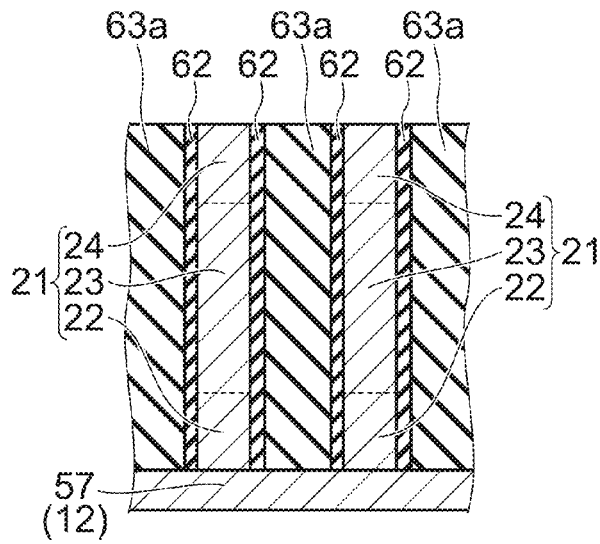

First, as shown in FIG. 15A, by patterning the upper layer portion of the silicon substrate 12, multiple local source lines 57 are formed; and the semiconductor members 21 are multiply formed on each of the local source lines 57 in columnar configurations in which the n$^+$-type portion 22, the p$^-$-type portion 23, and the n$^+$-type portion 24 are stacked in this order. Then, for example, silicon nitride films 62 are formed on the side surfaces of the semiconductor members 21 by ALD. Then, for example, an insulating film 63a that includes silicon oxide is filled by a PSZ method, etc., between the pillars formed of the semiconductor members 21 and the silicon nitride films 62.

Figure 15B:
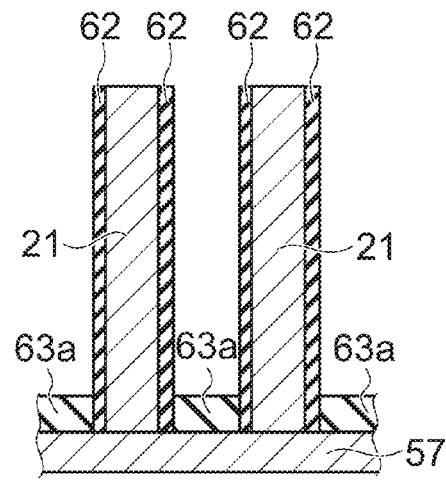

Then, as shown in FIG. 15B, the upper portions of the semiconductor members 21 and the upper portions of the silicon nitride films 62 are caused to protrude from the upper surface of the insulating film 63a by causing the upper surface of the insulating film 63a to recede by performing etch-back of the insulating film 63a.

Figure 15C:
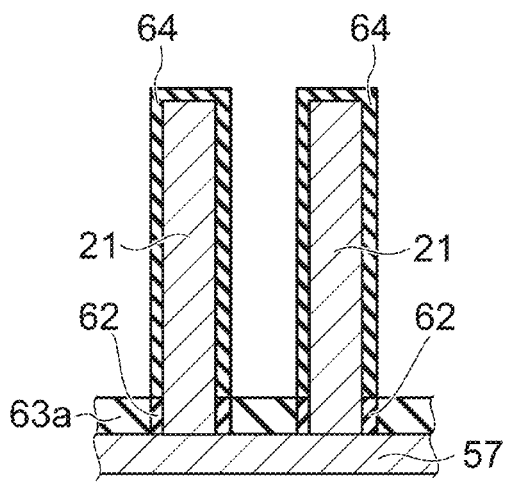

Then, as shown in FIG. 15C, the upper portions of the semiconductor members 21 are exposed by removing the exposed portions of the silicon nitride films 62. Then, thermal oxide films 64 are formed on the surfaces of the upper portions of the semiconductor members 21 by performing thermal oxidation treatment.

Figure 15D:
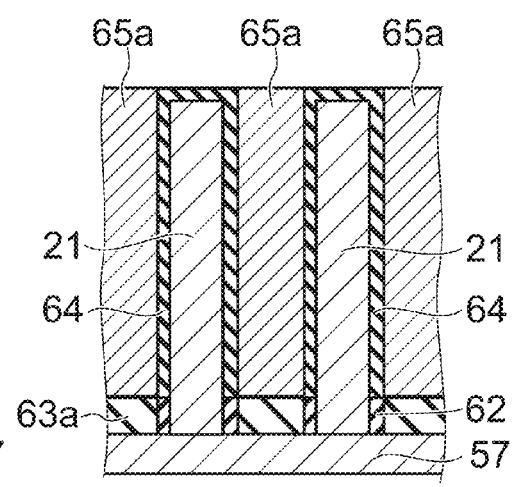

Then, as shown in FIG. 15D, an n-type polysilicon film 65a is deposited on the entire surface. Then, etch-back of the n-type polysilicon film 65a is performed using the thermal oxide films 64 as a stopper.

Figure 16A:
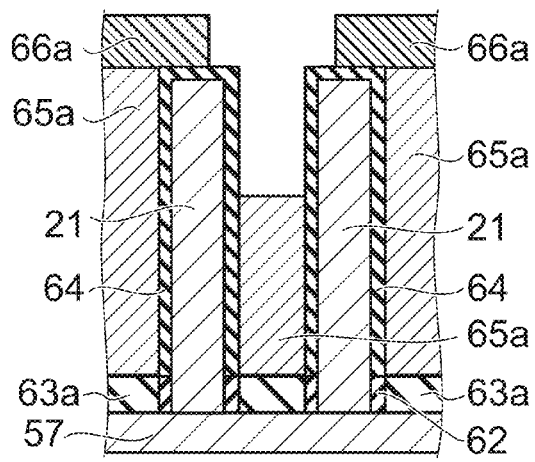

Then, as shown in FIG. 16A, a mask film 66a is formed to cover every other region of the regions between the semiconductor members 21 arranged along the X-direction. Then, the upper surface of the n-type polysilicon film 65a is caused to recede in every other region of the regions between the semiconductor members 21 by performing etching using the mask film 66a as a mask. Subsequently, the mask film 66a is removed.

Figure 16B:
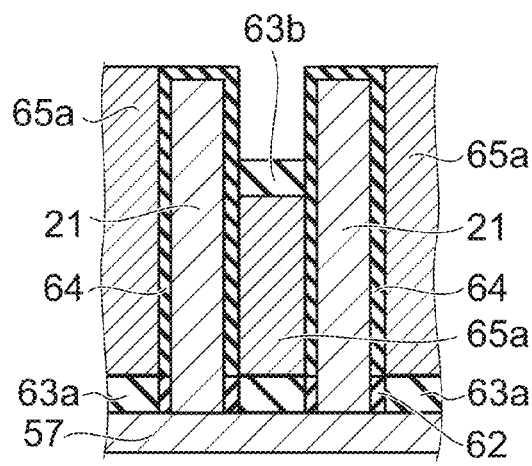

Then, as shown in FIG. 16B, for example, an insulating film 63b that includes silicon oxide is formed using a PSZ method; and etch-back is performed so that the insulating film 63b remains on the portion of the n-type polysilicon film 65a having the receded upper surface. At this time, the upper surface of the insulating film 63b is positioned lower than the upper surface of the portion of the n-type polysilicon film 65a that was covered with the mask film 66a.

Figure 16C:
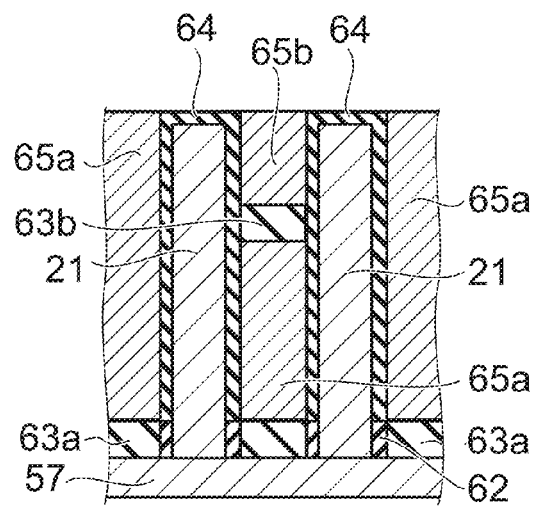

Then, as shown in FIG. 16C, an n-type polysilicon film 65b is deposited on the entire surface. Then, etch-back of the n-type polysilicon film 65b is performed using the thermal oxide films 64 as a stopper.

Figure 16D:
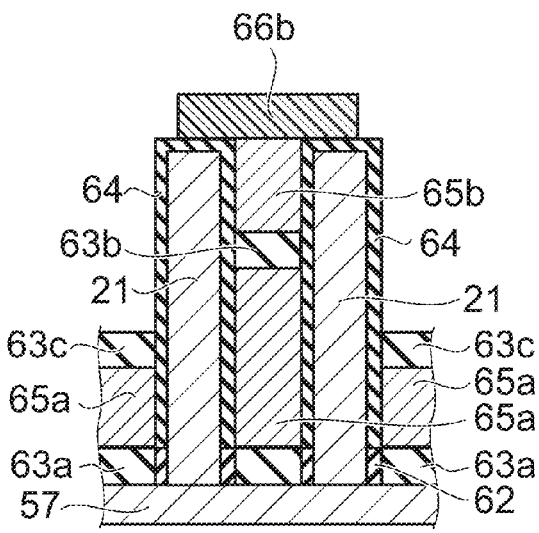

Then, as shown in FIG. 16D, a mask film 66b is formed in the regions where the mask film 66a was not disposed in the process shown in FIG. 16A; and the upper surface of the n-type polysilicon film 65a is caused to recede in the regions not covered with the mask film 66b by performing etching using the mask film 66b as a mask. At this time, the upper surface of the n-type polysilicon film 65a in this region is caused to be lower than the upper surface of the n-type polysilicon film 65a that was caused to recede in the process shown in FIG. 16A. Then, an insulating film 63c is formed on the exposed surface of the n-type polysilicon film 65a by forming silicon oxide using oxidation treatment or a PSZ method. Subsequently, the mask film 66b is removed.

Then, as shown in FIG. 17A, an n-type polysilicon film 65c is deposited on the entire surface. Then, etch-back of the n-type polysilicon film 65c is performed using the thermal oxide films 64 as a stopper.

Then, as shown in FIG. 17B, the upper surfaces of the n-type polysilicon films 65b and 65c are caused to recede and the upper portions of the semiconductor members 21 and the upper portions of the thermal oxide films 64 are caused to protrude from the upper surfaces of the n-type polysilicon films 65b and 65c by performing etch-back of the n-type polysilicon films 65b and 65c.

Then, as shown in FIG. 17C, for example, an insulating film 63d that includes silicon oxide is formed on the n-type polysilicon films 65a and 65b by depositing an insulator using a PSZ method and by performing etch-back using the thermal oxide films 64 as a stopper.

Then, as shown in FIG. 17D, the portions of the thermal oxide films 64 disposed on the upper surfaces of the semiconductor members 21 are removed. Thereby, the upper surfaces of the semiconductor members 21 are exposed.

Thus, the gate electrodes 25 that are made of n-type polysilicon and have two levels are formed. Thereafter, the integrated circuit device 6 is manufactured by normal methods.

Effects of the embodiment will now be described.

According to the embodiment, similarly to the second embodiment described above, because the formation region of the inversion layer Ru and the formation region of the inversion layer Rl overlap in a wide surface area in the selected member 21a, a bottleneck of the current between the inversion layer Ru and the inversion layer Rl is relaxed; and the ON current increases. On the other hand, by applying the OFF potential to the dummy electrodes 25d and 25e, the portions of the semiconductor member 21 opposing the dummy electrodes 25d and 25e are actively set to the non-conducting state. Thereby, the half-selected members 21b and 21c disposed to be adjacent to the selected member 21a on two sides can be reliably set to the OFF state. As a result, the ratio of the ON current and the OFF current in the semiconductor member 21 can be high; and the operations of the integrated circuit device are stabilized. Although the effect of reducing the OFF current is weaker, the dummy electrodes 25d and 25e may be in a floating state.

Otherwise, the configuration, the manufacturing method, the operations, and the effects of the embodiment are similar to those of the fifth embodiment described above.

Modification of Sixth Embodiment

A modification of the sixth embodiment will now be described.

Figure 18:
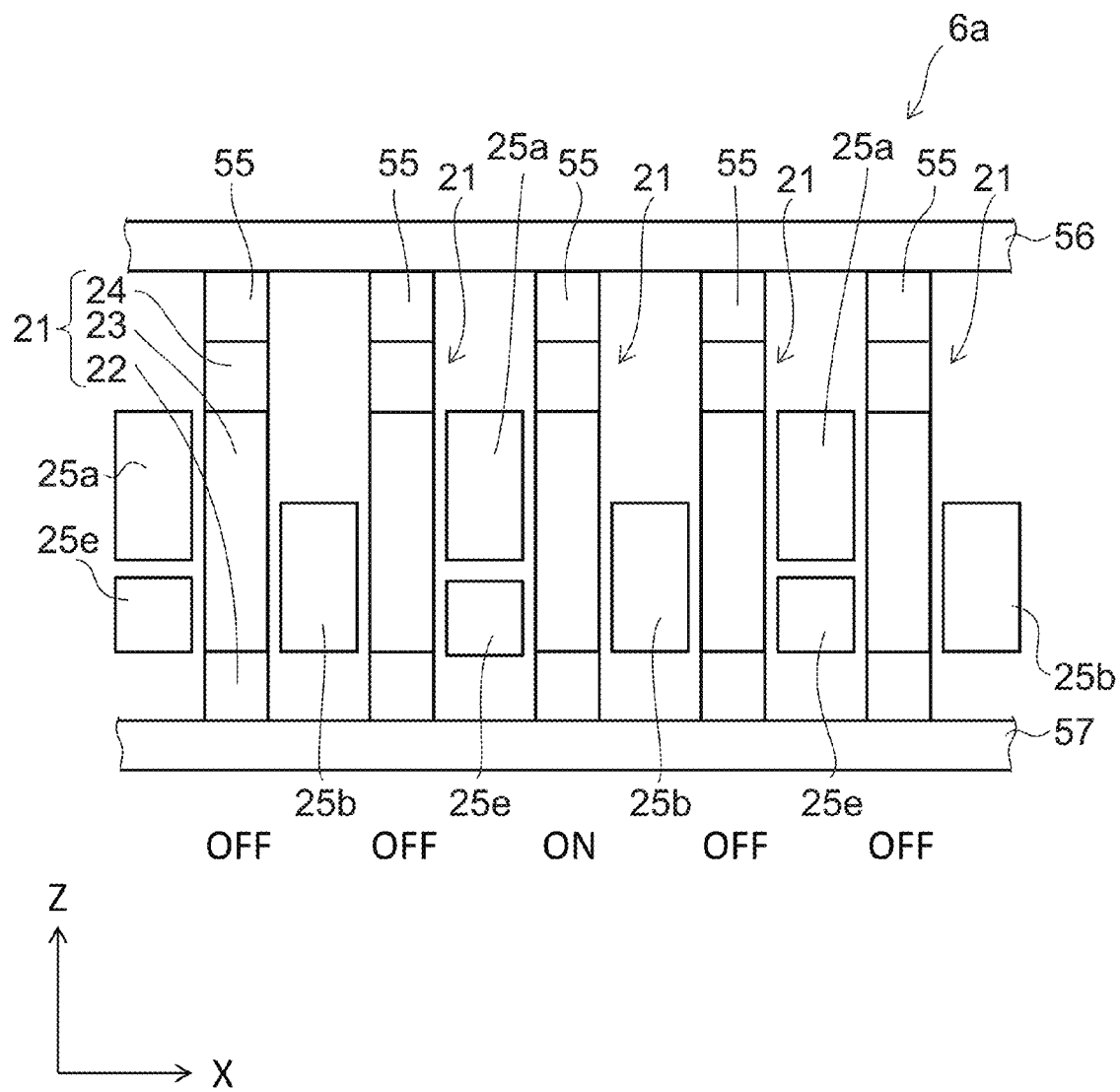
FIG. 18 is a schematic cross-sectional view showing an integrated circuit device according to a modification of the sixth embodiment.

FIG. 18 is a schematic cross-sectional view showing the integrated circuit device according to the modification. As shown in FIG. 18, the integrated circuit device 6a according to the modification differs from the integrated circuit device 6 according to the sixth embodiment (referring to FIG. 14) in that the dummy electrode 25d (referring to FIG. 14) is not provided. The dummy electrode 25e is provided. The distance between the silicon substrate 12 (referring to FIG. 13) and the lower end of the gate electrode 25b is shorter than the distance between the silicon substrate 12 and the lower end of the gate electrode 25a; and the distance between the silicon substrate 12 and the upper end of the gate electrode 25b is longer than the distance between the silicon substrate 12 and the lower end of the gate electrode 25a. Thereby, as viewed from the X-direction, the lower portion of the gate electrode 25a of the upper level and the upper portion of the gate electrode 25b of the lower level overlap.

A method for manufacturing the integrated circuit device according to the modification will now be described.

FIG. 19A to FIG. 20B are cross-sectional views showing the method for manufacturing the integrated circuit device according to the modification.

First, processes shown in FIG. 15A to FIG. 16A are implemented.

Then, as shown in FIG. 19A, for example, the insulating film 63b is formed by a PSZ method; and etch-back is performed using the thermal oxide films 64 as a mask so that the insulating film 63b remains on the portion of the n-type polysilicon film 65a having the receded upper surface. At this time, in the Z-direction, the position of the upper surface of the insulating film 63b is substantially the same as the position of the upper surface of the portion of the n-type polysilicon film 65a covered with the mask film 66a.

Then, as shown in FIG. 19B, the mask film 66b is formed in the regions where the mask film 66a was not disposed in the process shown in FIG. 16A; and etching is performed using the mask film 66b as a mask so that the upper surface of the n-type polysilicon film 65a recedes in the regions not covered with the mask film 66b. At this time, the upper surface of the n-type polysilicon film 65a in this region is caused to be lower than the upper surface of the n-type polysilicon film 65a that receded in the process shown in FIG. 16A. Then, the insulating film 63c is formed on the exposed surface of the n-type polysilicon film 65a by forming an insulating film using oxidation treatment or a PSZ method. Subsequently, the mask film 66b is removed.

Then, as shown in FIG. 19C, the n-type polysilicon film 65c is deposited on the entire surface. Then, etch-back of the n-type polysilicon film 65c is performed using the thermal oxide films 64 as a stopper.

Then, as shown in FIG. 19D, the upper portions of the semiconductor members 21, the upper portions of the thermal oxide films 64, and the upper portion of the insulating film 63b are caused to protrude from the upper surface of the n-type polysilicon film 65c by causing the upper surface of the n-type polysilicon film 65c to recede by performing etch-back of the n-type polysilicon film 65c.

Figure 20A:
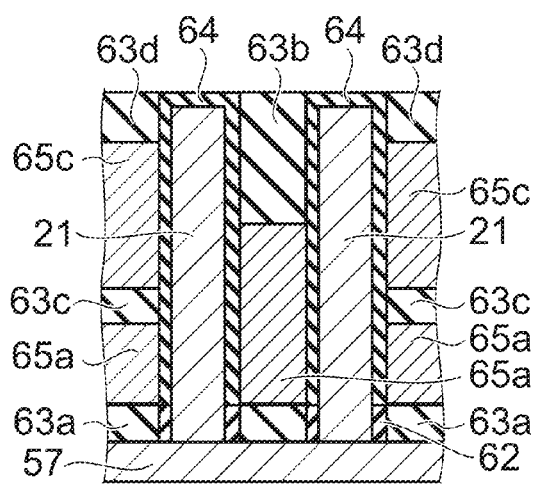

Then, as shown in FIG. 20A, for example, the insulating film 63d is formed on the n-type polysilicon films 65a and 65c by depositing an insulator by a PSZ method and by performing etch-back using the thermal oxide films 64 as a stopper.

Figure 20B:
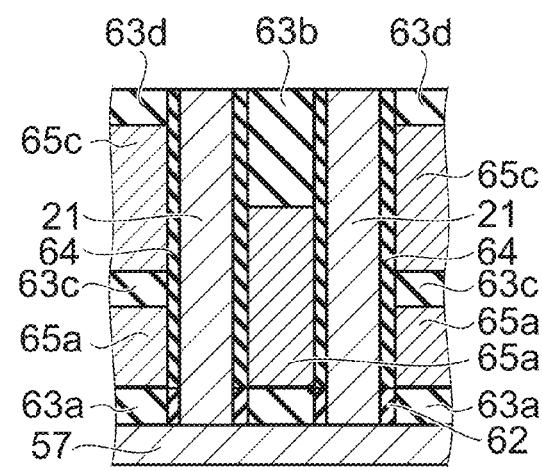

Then, as shown in FIG. 20B, the portions of the thermal oxide films 64 disposed on the upper surfaces of the semiconductor members 21 are removed. Thereby, the upper surfaces of the semiconductor members 21 are exposed.

Thereafter, the integrated circuit device 6a is manufactured by normal methods.

Effects of the modification will now be described.

According to the modification, it is no longer necessary to form the n-type polysilicon film 65b because the dummy electrode 25d is not disposed above the gate electrode 25b. In other words, it is sufficient to perform the depositing of the n-type polysilicon film twice. Also, it is no longer necessary to control the configuration of the dummy electrode 25d. For these reasons, compared to the sixth embodiment, the manufacturing processes of the modification are simple. Otherwise, the configuration, the manufacturing method, the operations, and the effects of the modification are similar to those of the sixth embodiment described above.

Seventh Embodiment

A seventh embodiment will now be described.

Figure 21C:
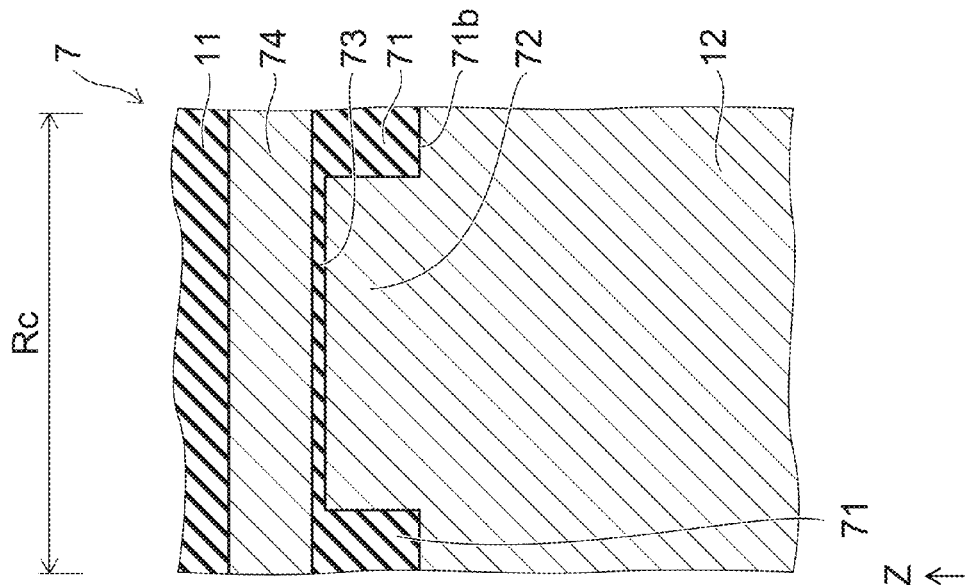
FIG. 21C is a cross-sectional view showing a peripheral circuit region of the integrated circuit device according to the seventh embodiment.
Figure 21B:
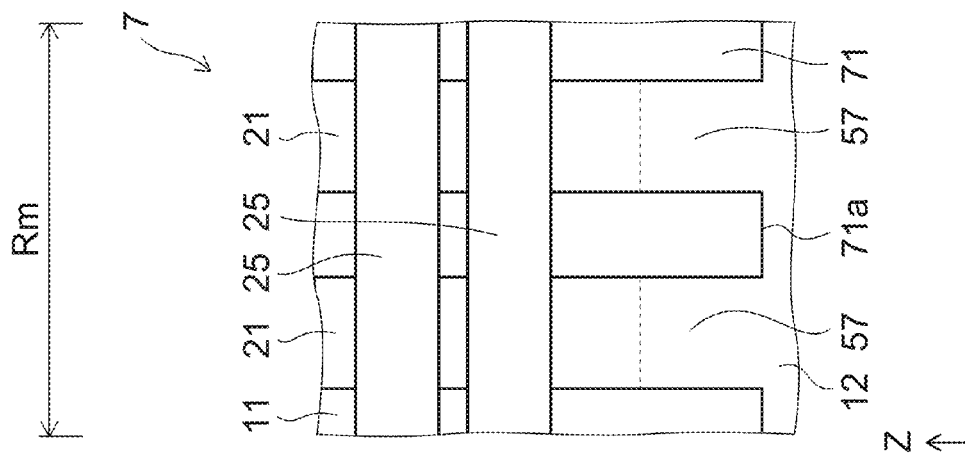
FIG. 21A and FIG. 21B are cross-sectional views showing a memory cell region of an integrated circuit device according to a seventh embodiment.
Figure 21A:
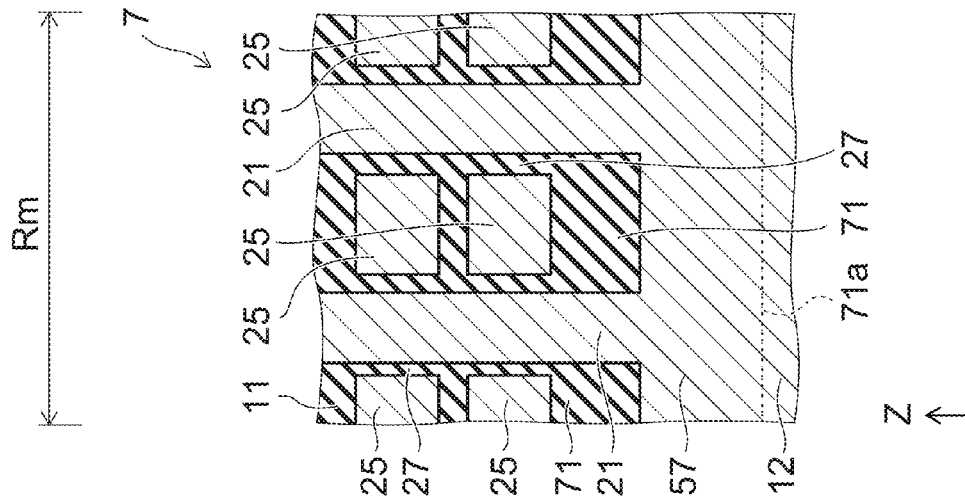

FIG. 21A and FIG. 21B are cross-sectional views showing the memory cell region of the integrated circuit device according to the embodiment; and FIG. 21C is a cross-sectional view showing the peripheral circuit region of the integrated circuit device according to the embodiment. The Z-direction positions are aligned between FIG. 21A to FIG. 21C.

In the integrated circuit device 7 according to the embodiment as shown in FIG. 21A to FIG. 21C, the memory cell region Rm that includes the interconnect selection unit 20 and the memory unit 30b (referring to FIG. 13) is provided; and the peripheral circuit region Rc in which the peripheral circuit is formed is provided.

In the memory cell region Rm as shown in FIG. 21A and FIG. 21B, the upper layer portion of the silicon substrate 12 is patterned to form the local source lines 57 and the semiconductor members 21; the local source lines 57 are electrically isolated from each other by a STI 71; and the lower portions of the semiconductor members 21 are electrically isolated from each other by the STI 71. Also, the upper portions of the semiconductor members 21 are separated from each other by the inter-layer insulating film 11. Further, the gate insulator film 27 is provided between the local source line 57 and the gate electrode 25. Similarly to the third embodiment described above (referring to FIG. 10), some of the gate electrodes 25 may be dummy electrodes to which a constant potential is applied. This is similar for the other embodiments described below as well.

In the peripheral circuit region Rc as shown in FIG. 21C, an active area 72 is provided in the upper layer portion of the silicon substrate 12. The active area 72 is electrically isolated from the surroundings by the STI 71 filled into the upper layer portion of the silicon substrate 12. Also, for example, a gate insulator film 73 that is made of silicon oxide is provided on the active area 72; and, for example, a gate electrode 74 that is made of polysilicon is provided on the gate insulator film 73.

Thus, in the memory cell region Rm, the STI 71 is disposed between the lower portions of the semiconductor members 21; and in the peripheral circuit region Rc, the STI 71 is disposed around the active area 72. Then, a lowermost surface 71a of the STI 71 in the memory cell region Rm is positioned lower than a lowermost surface 71b of the STI 71 in the peripheral circuit region Rc.

According to the embodiment, by setting the lowermost surface 71a of the STI 71 in the memory cell region Rm to be lower than the lowermost surface 71b of the STI 71 in the peripheral circuit region Rc, the upper layer portion of the silicon substrate 12 in the memory cell region Rm is selectively removed to form the local source lines 57 and the semiconductor members 21 to be sufficiently thick; while in the peripheral circuit region Rc, the formation of the STI 71 for partitioning the active area 72 can avoid being excessively deep. As a result, in the memory cell region Rm, the local source lines 57 are formed to be sufficiently thick; and the resistance of the local source lines 57 can be reduced. On the other hand, in the peripheral circuit region Rc, the volume of the STI 71 is prevented from becoming excessively large; and cracks that occur in the STI 71 can be suppressed.

Otherwise, the configuration, the manufacturing method, the operations, and the effects of the embodiment are similar to those of the fifth embodiment described above. Although an example is illustrated in the embodiment in which two gate electrodes 25 are provided, only one gate electrode may be provided.

Eighth Embodiment

An eighth embodiment will now be described.

Figure 22:
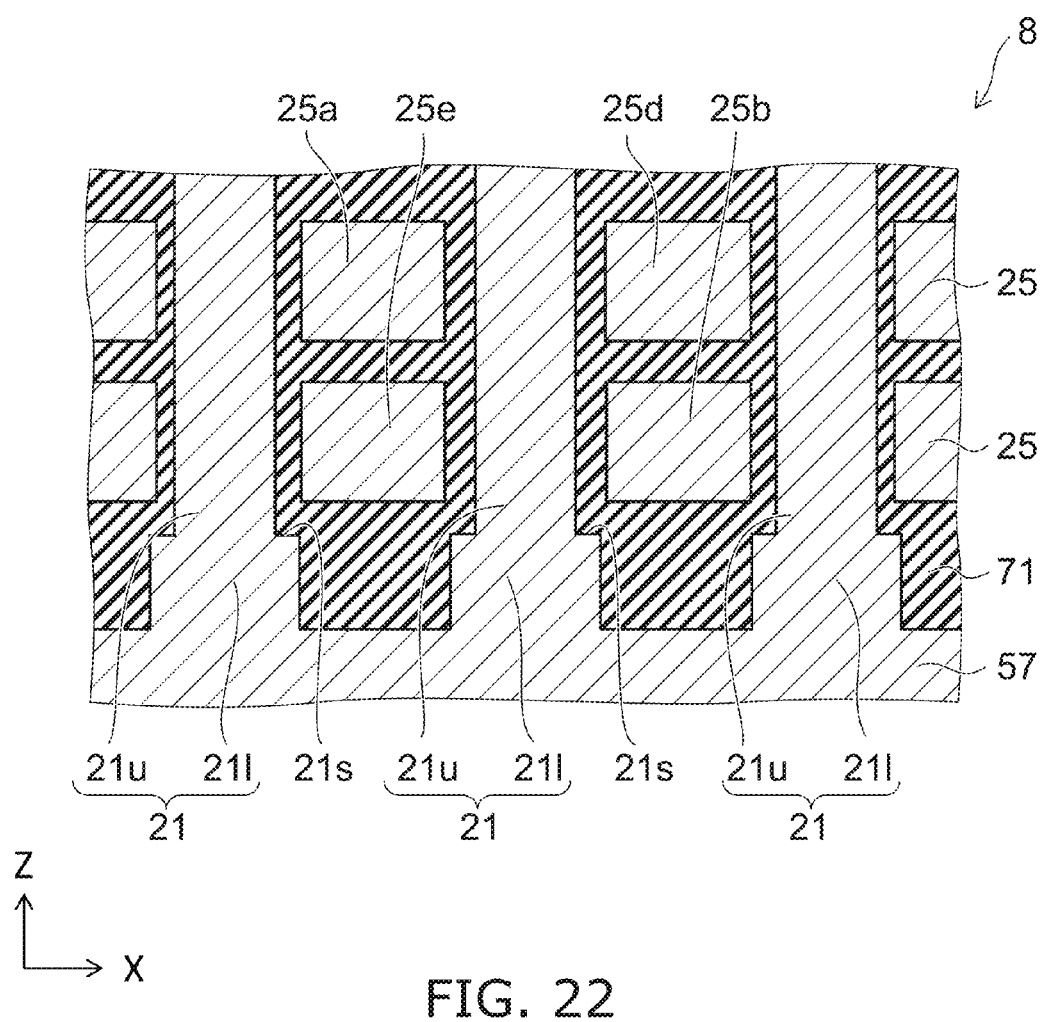
FIG. 22 is a cross-sectional view showing an interconnect selection unit of an integrated circuit device according to an eighth embodiment.

FIG. 22 is a cross-sectional view showing the interconnect selection unit of the integrated circuit device according to the embodiment.

As shown in FIG. 22, the integrated circuit device 8 according to the embodiment differs from the integrated circuit device 5 according to the fifth embodiment described above (referring to FIG. 13) in that a lower portion 21l of the semiconductor member 21 is wider than an upper portion 21u of the semiconductor member 21. Therefore, a stepped portion 21s is formed at the side surfaces of the semiconductor member 21 facing two X-direction sides between the lower portion 21l and the upper portion 21u of the semiconductor member 21. The upper portion 21u includes a portion opposing the two, i.e., upper and lower, levels of the gate electrodes 25.

According to the embodiment, by setting the lower portion 21l of the semiconductor member 21 to be relatively wide, the source resistance of the semiconductor member 21 linking the local source line 57 to the channel can be reduced. On the other hand, by setting the upper portion 21u of the semiconductor member 21 to be relatively fine, the controllability by the gate electrode 25 of the upper portion 21u is stronger; and the OFF current can be suppressed. Thereby, the difference between the ON current and the OFF current can be large. Otherwise, the configuration, the manufacturing method, and the effects of the embodiment are similar to those of the fifth embodiment described above.

First Modification of Eighth Embodiment

A first modification of the eighth embodiment will now be described.

Figure 23:
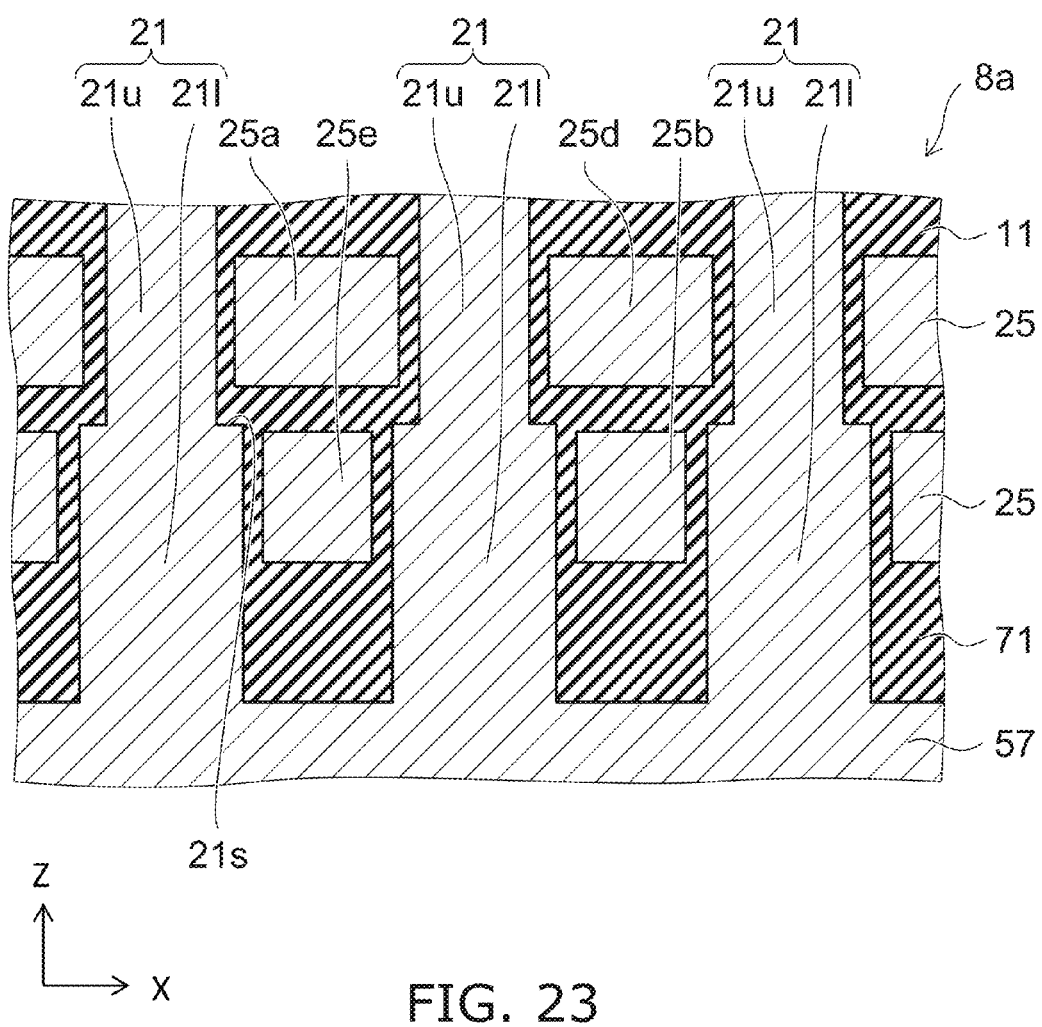
FIG. 23 is a cross-sectional view showing an interconnect selection unit of an integrated circuit device according to a first modification of the eighth embodiment.

FIG. 23 is a cross-sectional view showing the interconnect selection unit of the integrated circuit device according to the modification.

In the integrated circuit device 8a according to the modification as shown in FIG. 23, compared to the integrated circuit device 8 according to the eighth embodiment described above (referring to FIG. 17), the position of the stepped portion 21s of the semiconductor member 21 is high. Specifically, in the eighth embodiment described above, the two, i.e., upper and lower, levels of the gate electrodes 25 oppose the upper portion 21u; but in the modification, only the gate electrode 25a of the upper level and the dummy electrode 25d of the upper level oppose the upper portion 21u; and the gate electrode 25b of the lower level and the dummy electrode 25e of the lower level oppose the lower portion 21l. Also, the gate electrode 25b and the dummy electrode 25e of the lower level are finer than the gate electrode 25a and the dummy electrode 25d of the upper level.

According to the modification, the channel resistance of the semiconductor member 21 can be reduced because the distance between the gate electrode of the lower level and the channel of the gate electrode of the upper level is shorter. On the other hand, according to the eighth embodiment described above, because the controllability by the gate electrode of the lower level is high compared to the modification, the OFF current can be suppressed effectively. Otherwise, the configuration, the manufacturing method, and the effects of the modification are similar to those of the eighth embodiment.

The modification may be combined with the eighth embodiment. In other words, the semiconductor member 21 may have a three-level configuration; the upper portion that opposes the gate electrode 25 of the upper level may be the finest; the central portion that opposes the gate electrode 25 of the lower level may be the next finer; and the lower portion that is connected to the local source line 57 may be the widest. In such a case, stepped portions are formed at the side surface of the semiconductor member 21 at two locations separated in the Z-direction. The semiconductor member 21 may have a configuration of four levels or more. In such a case, the stepped portions are formed at three or more locations.

Second Modification of Eighth Embodiment

A second modification of the eighth embodiment will now be described.

Figure 24:
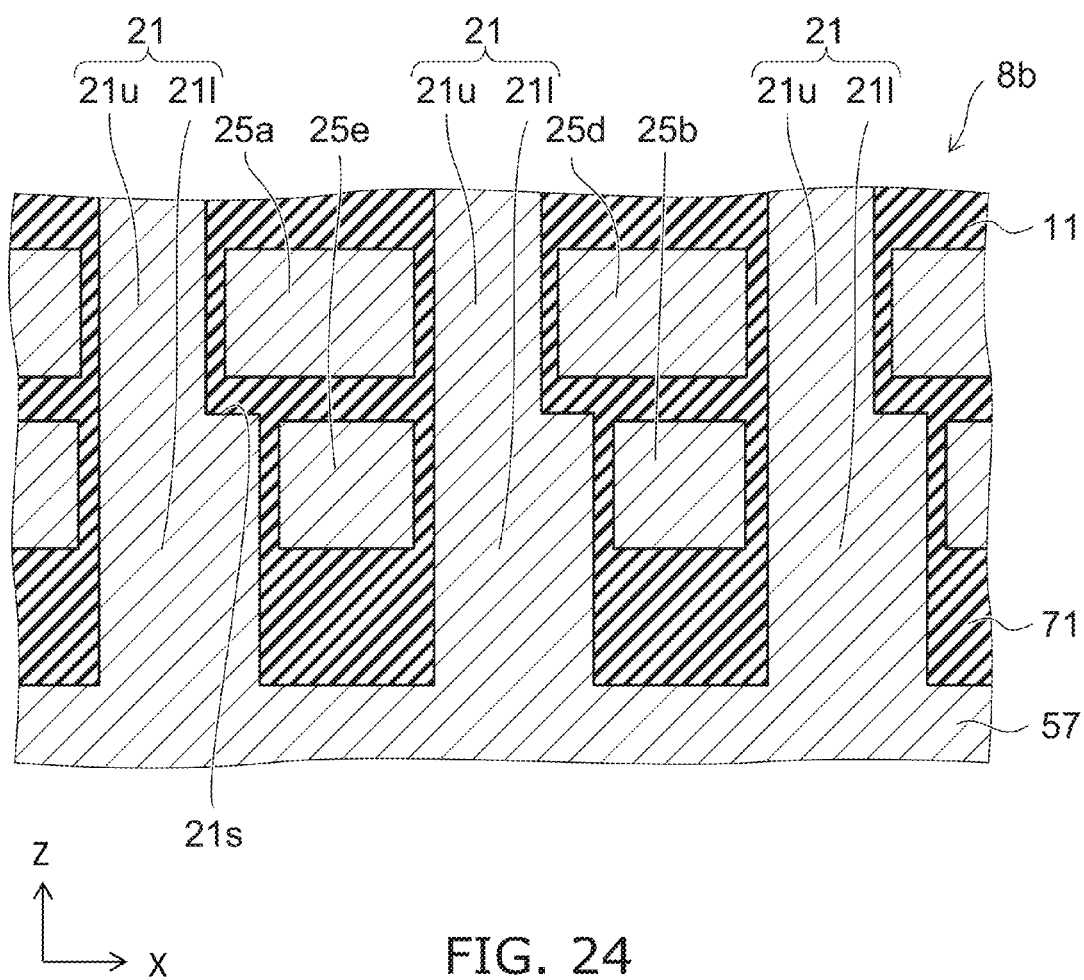
FIG. 24 is a cross-sectional view showing an interconnect selection unit of an integrated circuit device according to a second modification of the eighth embodiment.

FIG. 24 is a cross-sectional view showing the interconnect selection unit of the integrated circuit device according to the modification.

As shown in FIG. 24, the integrated circuit device 8b according to the modification differs from the integrated circuit device 8a according to the first modification (referring to FIG. 23) in that the stepped portion 21s of the semiconductor member 21 is formed only at a side surface facing one side in the X-direction and is not formed at the side surface facing the other side. Otherwise, the configuration, the manufacturing method, and the effects of the modification are similar to those of the first modification of the eighth embodiment.

Ninth Embodiment

A ninth embodiment will now be described.

Figure 25:
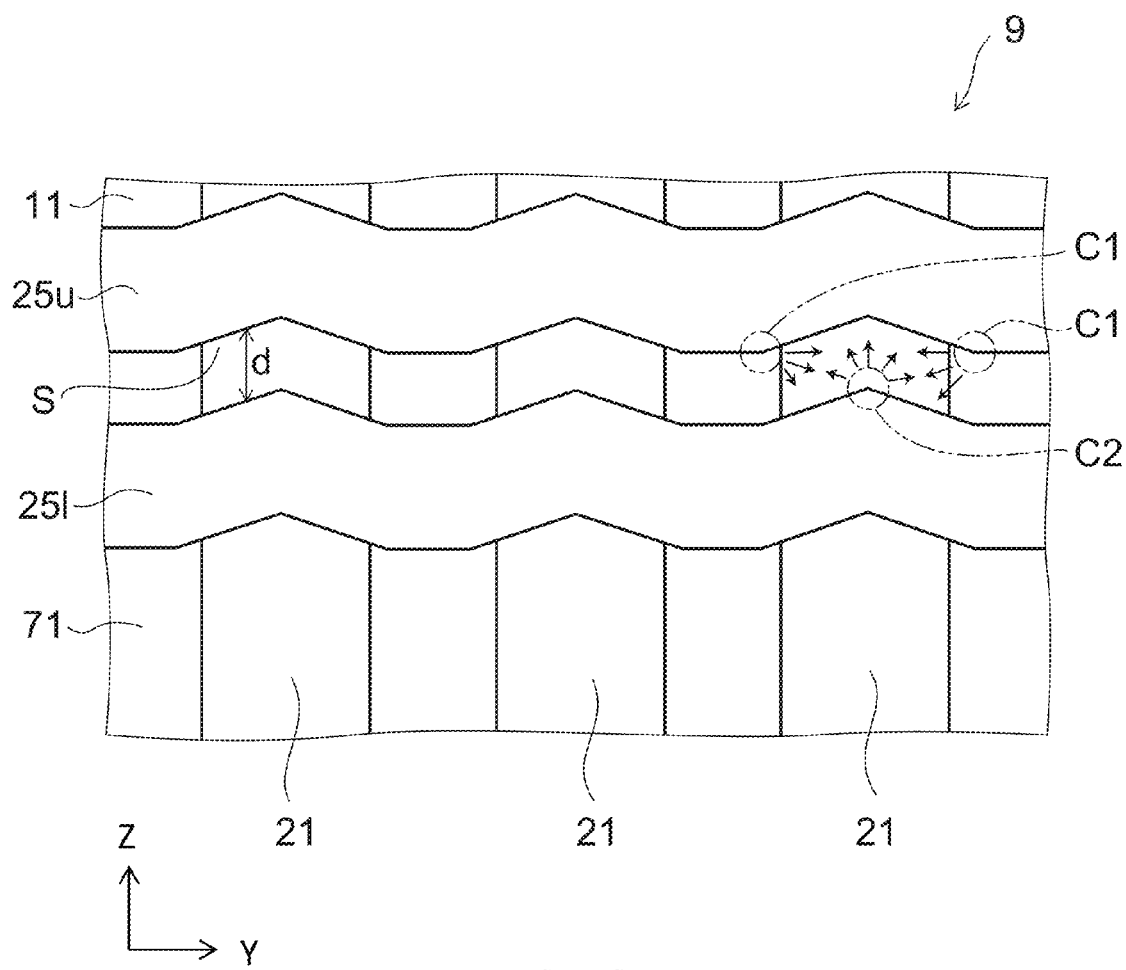
FIG. 25 is a cross-sectional view showing an interconnect selection unit of an integrated circuit device according to a ninth embodiment.

FIG. 25 is a cross-sectional view showing the interconnect selection unit of the integrated circuit device according to the embodiment.

As shown in FIG. 25, two, i.e., upper and lower, levels of the gate electrodes 25*l* and 25*u* (also generally called the "gate electrode 25") are provided in the integrated circuit device 9 according to the embodiment. The configuration of each of the gate electrodes 25 is a wave-like configuration that extends in the Y-direction while oscillating periodically in the Z-direction. The round trip period of the wave-like configuration of the gate electrode 25 is equal to the arrangement period of the semiconductor members 21 in the Y-direction and, for example, has its highest position at positions opposing the Y-direction central portions of the semiconductor members 21 and has its lowest position at positions opposing the midpoints between the semiconductor members 21. Also, the distance d between the gate electrode 25*u* of the upper level and the gate electrode 25*l* of the lower level is substantially constant at any position in the Y-direction.

By setting the configuration of the gate electrode 25 to be a wave-like configuration in the embodiment, a corner C1 of the lower surface of the gate electrode 25*u* of the upper level and a corner C2 of the upper surface of the gate electrode 25*l* of the lower level protrude into a gap S between the two gate electrodes 25. Thereby, the electric field that is generated by the two gate electrodes 25 easily extends around into the portion of the semiconductor member 21 opposing the gap S; and the controllability by the gate electrodes 25 of the semiconductor member 21 increases. As a result, in the portion of the semiconductor member 21 opposing the gap S, the inversion layer Ru formed in the upper portion of the semiconductor member 21 (referring to FIG. 8) is connected more easily to the inversion layer Rl formed in the lower portion of the semiconductor member 21 (referring to FIG. 8); and the ON current that flows through the semiconductor member 21 can be increased. Also, by setting the distance d between the two gate electrodes 25 to be constant, the breakdown voltage between the gate electrodes 25 can be ensured.

Thus, according to the embodiment, the gap S between the gate electrodes 25 can be effectively short and the ON current can be increased while ensuring the breakdown voltage between the gate electrodes 25. Otherwise, the configuration, the manufacturing method, and the effects of the embodiment are similar to those of the sixth embodiment described above.

Tenth Embodiment

A tenth embodiment will now be described.

Figure 26:
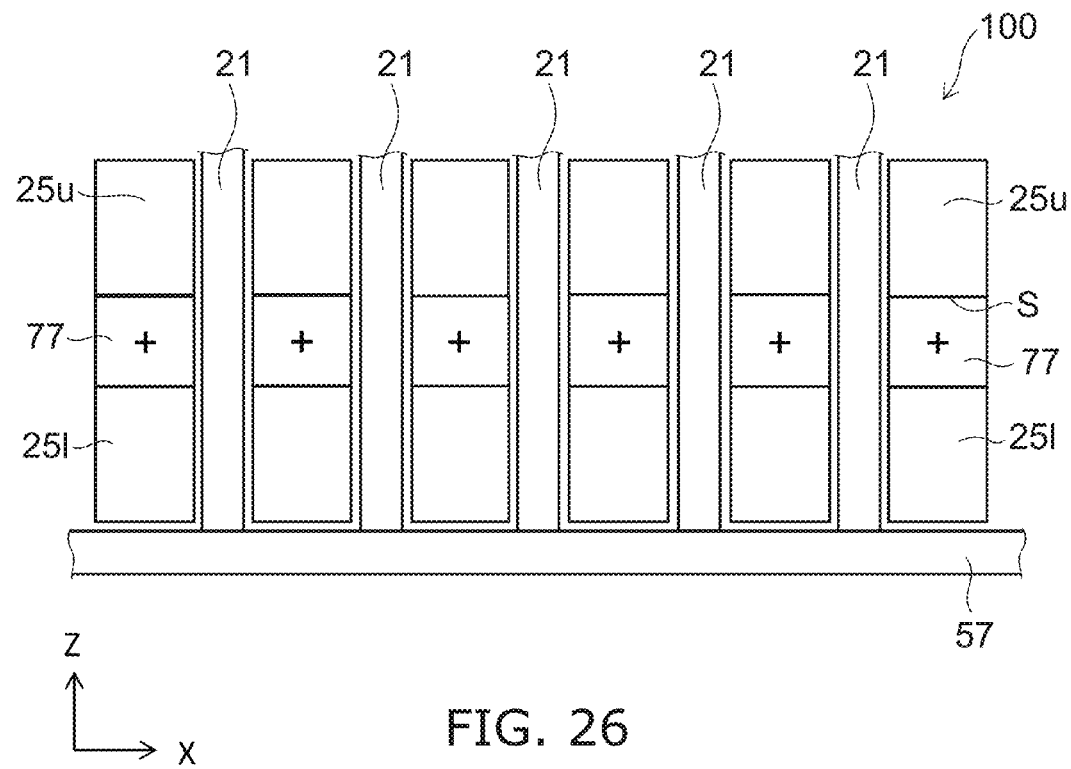
FIG. 26 is a cross-sectional view showing an interconnect selection unit of an integrated circuit device according to a tenth embodiment.

FIG. 26 is a cross-sectional view showing the interconnect selection unit of the integrated circuit device according to the embodiment.

In the integrated circuit device 100 according to the embodiment as shown in FIG. 26, a fixed charge-containing insulating film 77 is provided between the gate electrode 25*l* of the lower level and the gate electrode 25*u* of the upper level. The fixed charge-containing insulating film 77 is an insulating film that can generate a positive fixed charge at the vicinity of the semiconductor member 21. For example, the fixed charge-containing insulating film 77 is formed of nitrogen-containing silicon oxide (SiON) using PSZ as a source material.

According to the embodiment, the portion of the semiconductor member 21 opposing the gap S between the gate electrodes 25 is easily switched to the ON state by the fixed charge-containing insulating film 77 generating the positive fixed charge. Thereby, a good connection is formed between the inversion layer Ru and the inversion layer Rl; and the ON current can be increased. Otherwise, the configuration, the manufacturing method, and the effects of the embodiment are similar to those of the sixth embodiment described above.

The material of the fixed charge-containing insulating film 77 is not limited to nitrogen-containing silicon oxide; and it is sufficient to use an insulative material that generates a positive fixed charge. For example, silicon nitride (SiN) may be used. Also, silicon oxide containing aluminum (Al), hafnium (Hf), etc., may be used.

Eleventh Embodiment

An eleventh embodiment will now be described.

Figure 27:
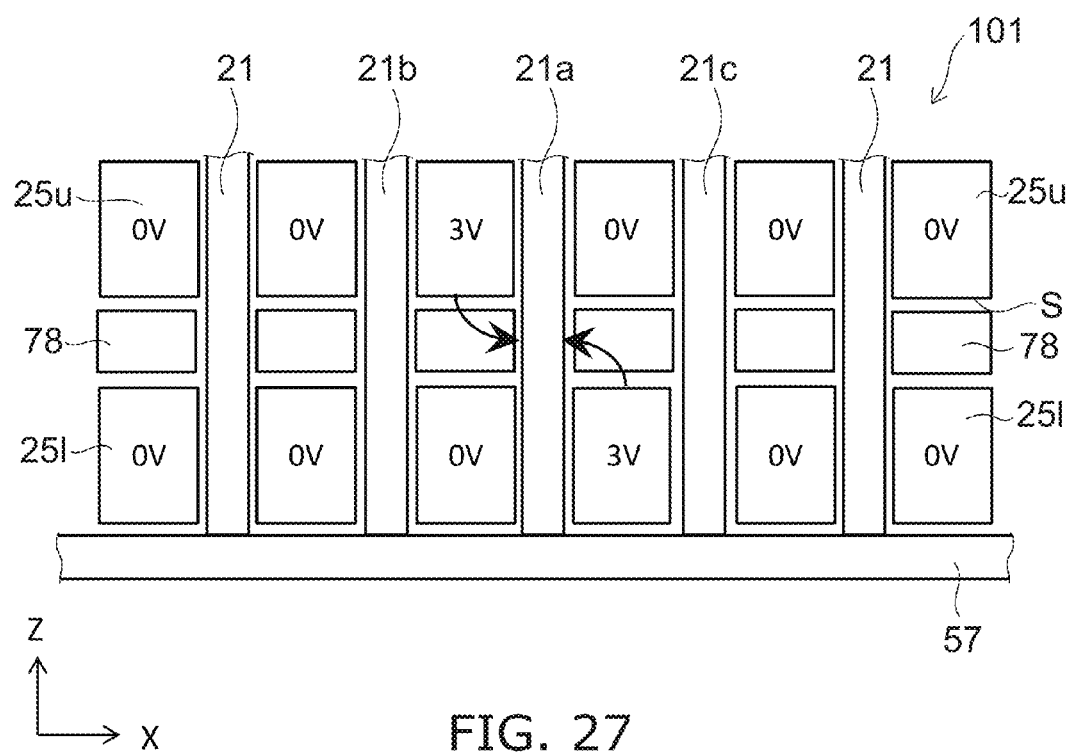
FIG. 27 is a schematic cross-sectional view showing an interconnect selection unit of an integrated circuit device according to an eleventh embodiment.

FIG. 27 is a schematic cross-sectional view showing the interconnect selection unit of the integrated circuit device according to the embodiment.

In the integrated circuit device 101 according to the embodiment as shown in FIG. 27, a high dielectric constant film 78 is provided between the gate electrode 25*l* of the lower level and the gate electrode 25*u* of the upper level. The high dielectric constant film 78 is formed of a material having a dielectric constant that is higher than the dielectric constant of silicon oxide, e.g., aluminum oxide ($Al_2O_3$).

A method for manufacturing the integrated circuit device according to the embodiment will now be described.

FIG. 28A to FIG. 28D are cross-sectional views of processes, showing the method for manufacturing the interconnect selection unit of the integrated circuit device according to the embodiment.

First, as shown in FIG. 27, the local source lines 57 that extend in the X-direction and the semiconductor members 21 that have columnar configurations extending in the Z-direction are formed by patterning the upper layer portion of the silicon substrate 12. Then, a STI (not shown) is filled between the local source lines 57.

Figure 28A:
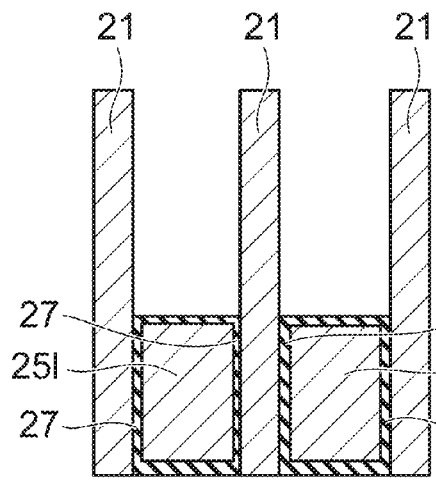
FIG. 28A to FIG. 28D are cross-sectional views of processes, showing a method for manufacturing the interconnect selection unit of the integrated circuit device according to the eleventh embodiment.

Then, as shown in FIG. 28A, the gate insulator films 27 are formed on the side surfaces of the semiconductor members 21. Then, the multiple gate electrodes 25*l* that extend in the Y-direction are formed by forming a polysilicon film and by patterning the polysilicon film.

Figure 28B:
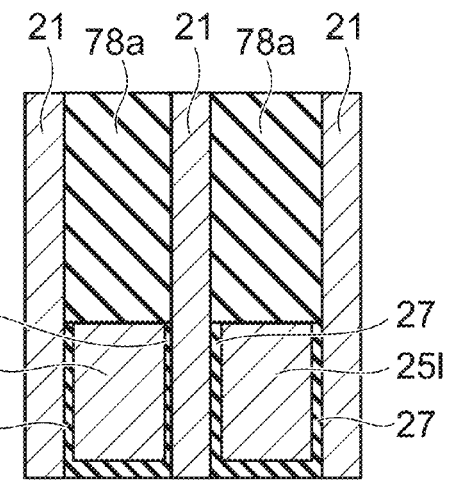

Then, as shown in FIG. 28B, a high dielectric constant material 78*a* of alumina, etc., is deposited on the entire surface. Then, planarization of the high dielectric constant material 78*a* is performed by CMP (Chemical Mechanical Polishing), etc., using the semiconductor members 21 as a stopper.

Figure 28C:
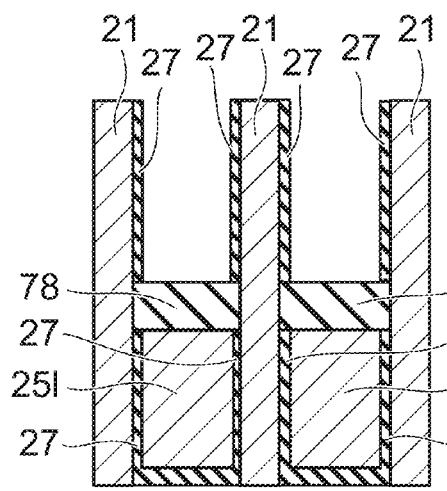

Then, as shown in FIG. 28C, the upper surface of the high dielectric constant material 78*a* is caused to recede by recessing. Thereby, the high dielectric constant films 78 are formed. Then, the gate insulator films 27 are formed on the exposed surfaces of the semiconductor members 21.

Figure 28D:
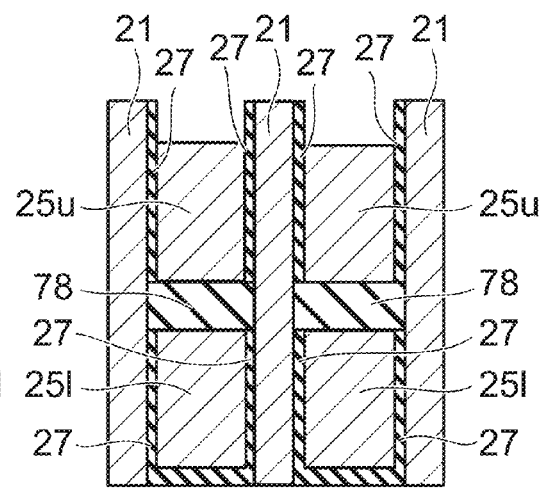

Then, as shown in FIG. 28D, the multiple gate electrodes 25*u* that extend in the Y-direction are formed by forming a polysilicon film on the high dielectric constant films 78 and by patterning the polysilicon film. Thereafter, the integrated circuit device 101 according to the embodiment is manufactured by performing normal processes.

Effects of the embodiment will now be described.

According to the embodiment, by providing the high dielectric constant film 78 between the gate electrodes 25, the electrical distance between the gate electrode 25 and the portion of the semiconductor member 21 opposing the gap S between the gate electrodes 25 is shorter. Therefore, the gap S is effectively shorter; a good connection can be formed between the inversion layer Ru and the inversion layer Rl; and the ON current can be increased. Otherwise, the configuration, the manufacturing method, and the effects of the embodiment are similar to those of the sixth embodiment described above.

The material of the high dielectric constant film 78 is not limited to aluminum oxide; and it is sufficient to use an insulative material having a dielectric constant higher than that of silicon oxide. For example, hafnium oxide ($HfO_2$), lanthanum oxide ($LaO_2$), tantalum oxide (TaO), titanium oxide ($TiO_2$), tungsten oxide ($WO_3$), silicon nitride (SiN), or silicon oxynitride (SiON) may be used. Also, as the high dielectric constant film 78, layers that are made of high dielectric constant materials may be multiply stacked; and a layer that is made of a high dielectric constant material may be stacked with a silicon oxide layer.

Twelfth Embodiment

A twelfth embodiment will now be described.

Figure 29:
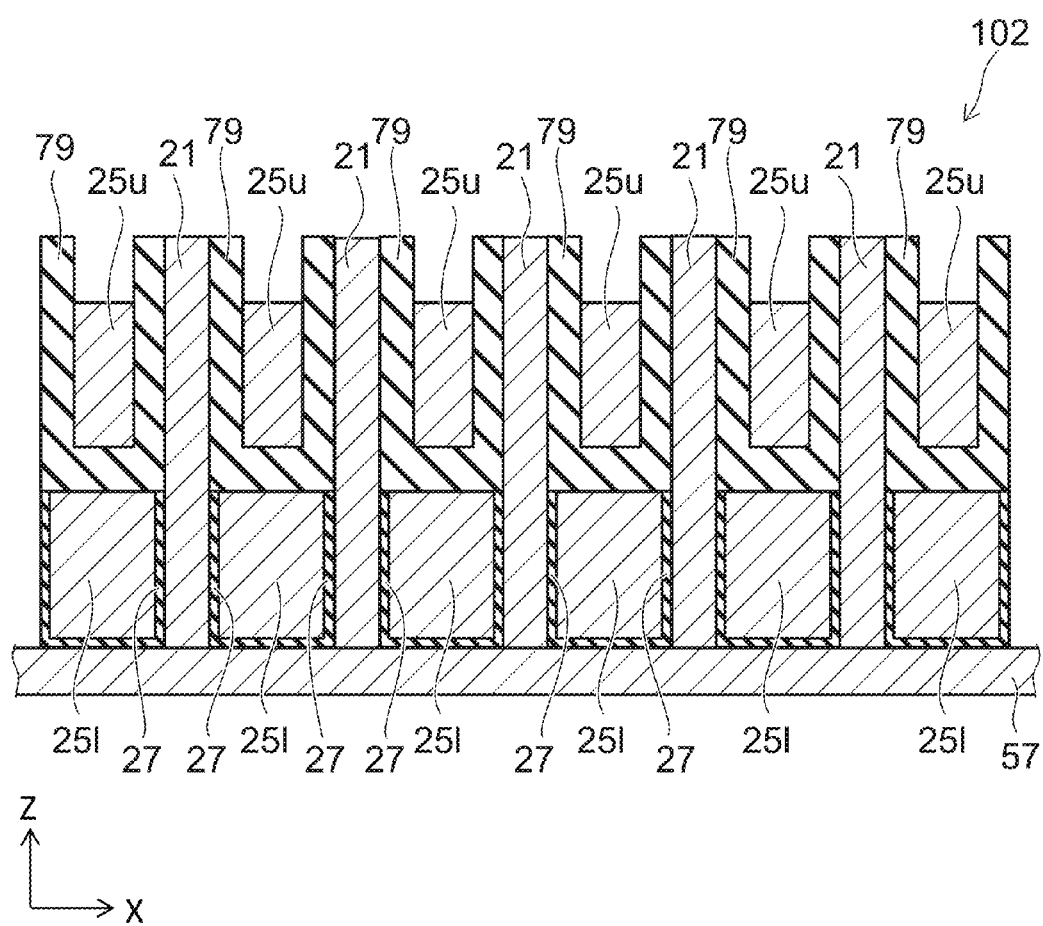
FIG. 29 is a schematic cross-sectional view showing an interconnect selection unit of an integrated circuit device according to a twelfth embodiment.

FIG. 29 is a schematic cross-sectional view showing the interconnect selection unit of the integrated circuit device according to the embodiment.

As shown in FIG. 29, the integrated circuit device 102 according to the embodiment differs from the integrated circuit device 101 according to the eleventh embodiment described above in that a high dielectric constant film 79 is disposed not only between the gate electrode 25*l* of the lower level and the gate electrode 25*u* of the upper level but also between the semiconductor member 21 and the gate electrode 25*u* of the upper level. In other words, the configuration of the high dielectric constant film 79 in the XZ cross section is U-shaped; the gate electrode 25*l* of the lower level is disposed below the high dielectric constant film 79; and the gate electrode 25*u* of the upper level is disposed in the interior of the high dielectric constant film 79. Thereby, the high dielectric constant film 79 also is used as the gate insulator film of the gate electrode 25*u* of the upper level. The upper end of the high dielectric constant film 79 protrudes from the upper surface of the gate electrode 25*u*. In other words, the distance between the silicon substrate 12 and a first point of the high dielectric constant film 79 most distal to the silicon substrate 12 is longer than the distance between the silicon substrate 12 and a second point of the gate electrode 25*u* most distal to the silicon substrate 12.

Also, the high dielectric constant film 79 is thicker than the gate insulator film 27. Therefore, the width of the gate electrode 25*u* of the upper level is narrower than the width of the gate electrode 25*l* of the lower level. Further, the upper surface of the gate electrode 25*u* is at a position that is lower than the upper end of the high dielectric constant film 79. Further, similarly to the eleventh embodiment described above, the material of the high dielectric constant film 79 is, for example, a high dielectric constant material such as alumina, hafnium oxide, lanthanum oxide, tantalum oxide, titanium oxide, tungsten oxide, silicon nitride, silicon oxynitride, etc.

An example of the dimensions of the components of the integrated circuit device 102 according to the embodiment will now be illustrated. The width of the semiconductor member 21 is 10 nm. The heights of the gate electrodes 25*u* and 25*l* are 25 nm. The width of the gate electrode 25*l* of the lower level is 14 nm; and the width of the gate electrode 25*u* of the upper level is 7 nm. The high dielectric constant film 79 is made of alumina; the relative dielectric constant ∈ of the high dielectric constant film 79 is 8.5; and the thickness of the high dielectric constant film 79 is 6.5 nm. However, an oxide film equivalent film thickness Tox of the high dielectric constant film 79 is 5 nm. The thickness of the gate insulator film 27 is 3 nm. The total of the width (14 nm) of the gate electrode 25*l* of the lower level and the thicknesses of the gate insulator films 27 on the two sides of the gate electrode 25*l* (3 nm each) is 20 nm, which is equal to the total of the width (7 nm) of the gate electrode 25*u* of the upper level and the thicknesses of the high dielectric constant films 79 on the two sides of the gate electrode 25*u* (6.5 nm each).

A method for manufacturing the integrated circuit device according to the embodiment will now be described.

Figure 30A:
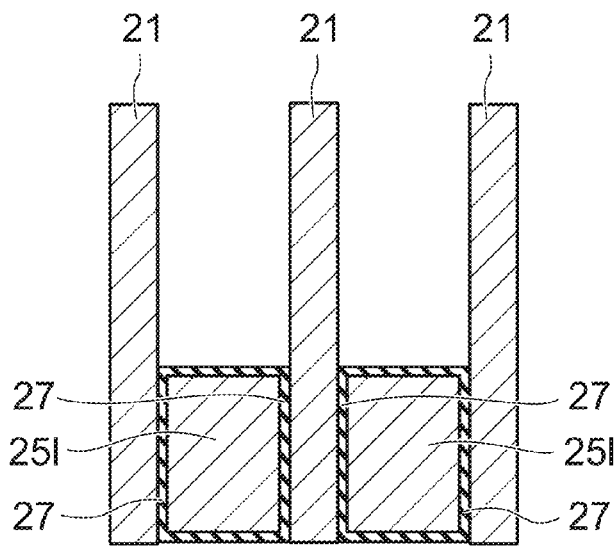
FIG. 30A to FIG. 30C are cross-sectional views of processes, showing a method for manufacturing the interconnect selection unit of the integrated circuit device according to the twelfth embodiment.
Figure 30B:
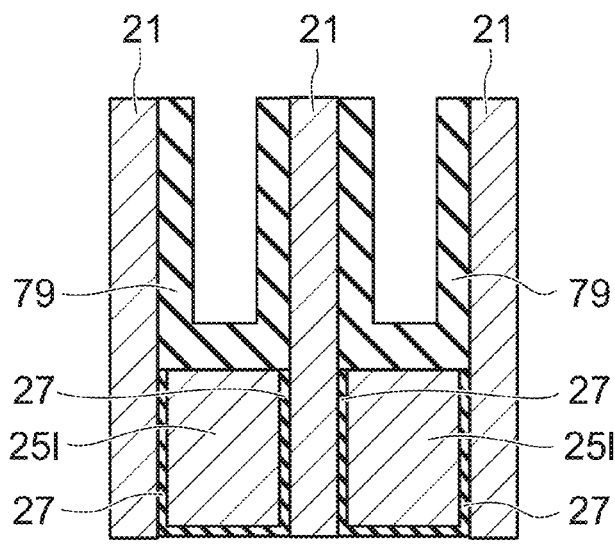
Figure 30C:
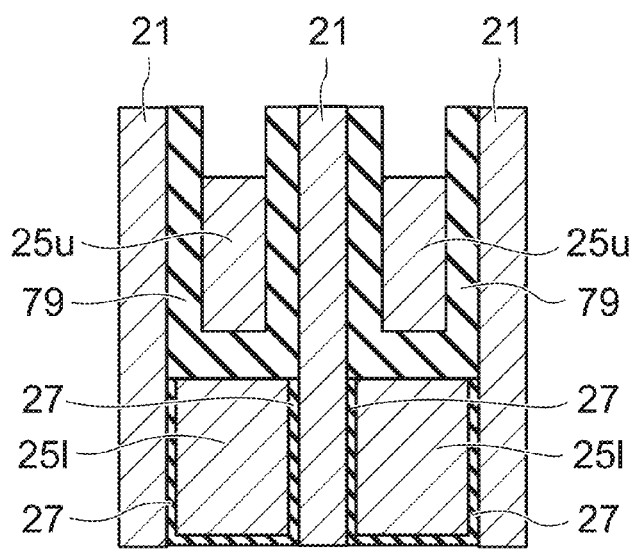

FIG. 30A to FIG. 30C are cross-sectional views of processes, showing the method for manufacturing the interconnect selection unit of the integrated circuit device according to the embodiment.

First, as shown in FIG. 30A, the local source lines 57, the semiconductor members 21, the gate insulator films 27, and the gate electrodes 25*l* of the lower level are formed by methods similar to those of the eleventh embodiment described above.

Then, as shown in FIG. 30B, the high dielectric constant films 79 are deposited on the upper surfaces of the gate electrodes 25*l* and on the side surfaces of the upper portions of the semiconductor members 21. At this time, the space between the semiconductor members 21 is not completely filled with the high dielectric constant films 79.

Then, as shown in FIG. 30C, the multiple gate electrodes 25*u* that extend in the Y-direction are formed by depositing, for example, a polysilicon film inside the spaces surrounded with the high dielectric constant films 79 on three sides. Thereafter, the integrated circuit device 102 according to the embodiment is manufactured by performing normal processes.

Effects of the embodiment will now be described.

In the embodiment, the inter-electrode insulating film between the gate electrode 25*l* and the gate electrode 25*u* and the gate insulator film of the gate electrode 25*u* can be formed simultaneously by forming the high dielectric constant film 79 only once in the process shown in FIG. 30B. Therefore, a dedicated process for forming the gate insulator film 27 opposing the gate electrode 25*u* of the upper level (referring to FIG. 28D) is unnecessary. Also, CMP processing of the high dielectric constant material 78*a* such as that shown in FIG. 28B is unnecessary. Further, a recess process of the high dielectric constant film such as that shown in FIG. 28C is unnecessary. Thus, for the integrated circuit device according to the embodiment, the number of processes for manufacturing is low; and the productivity is high.

Also, in the embodiment, the gate electrode 25*u* of the upper level is set to be finer than the gate electrode 25*l* of the lower level. Thereby, the opposing surface area between the gate electrodes 25 decreases; and the parasitic capacitance between the gate electrodes 25 can be reduced. Otherwise, the configuration, the manufacturing method, and the effects of the embodiment are similar to those of the eleventh embodiment described above.

First Modification of Twelfth Embodiment

A first modification of the twelfth embodiment will now be described.

Figure 31:
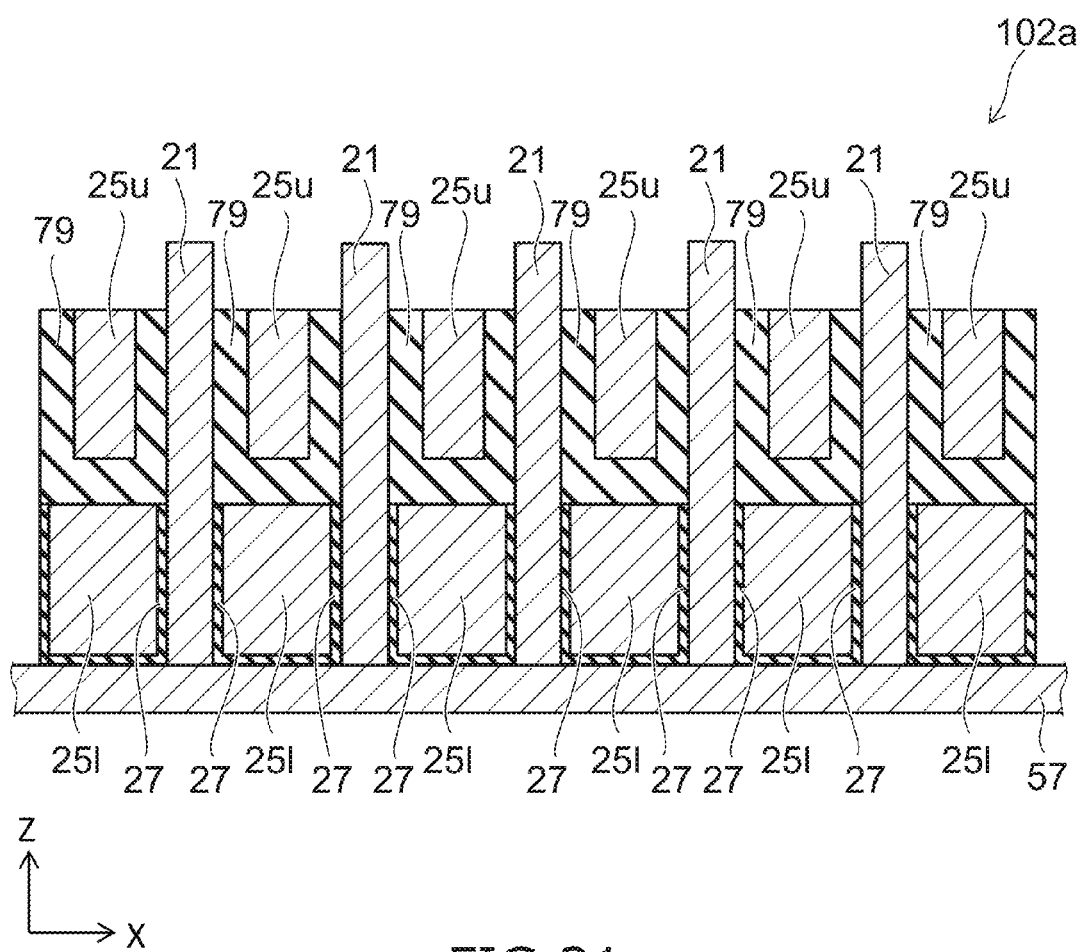
FIG. 31 is a schematic cross-sectional view showing an interconnect selection unit of an integrated circuit device according to a first modification of the twelfth embodiment.

FIG. 31 is a schematic cross-sectional view showing the interconnect selection unit of the integrated circuit device according to the modification.

As shown in FIG. 31, the integrated circuit device 102*a* according to the modification differs from the integrated circuit device 102 according to the twelfth embodiment described above (referring to FIG. 29) in that the position of the upper end of the high dielectric constant film 79 is substantially equal to or lower than the position of the upper surface of the gate electrode 25$u$ in the Z-direction. In other words, the distance between the silicon substrate 12 and the first point of the high dielectric constant film 79 most distal to the silicon substrate 12 is not more than the distance between the silicon substrate 12 and the second point of the gate electrode 25$u$ most distal to the silicon substrate 12.

Thereby, while the high dielectric constant film 79 functions as the gate insulator film by being interposed between the gate electrode 25$u$ and the semiconductor member 21, the parasitic capacitance between the gate electrode 25$u$ and the conductive members disposed above the gate electrode 25$u$ can be reduced because the high dielectric constant film 79 is not disposed above the gate electrode 25$u$. Otherwise, the configuration, the manufacturing method, and the effects of the modification are similar to those of the twelfth embodiment described above.

Second Modification of Twelfth Embodiment

A second modification of the twelfth embodiment will now be described.

Figure 32:
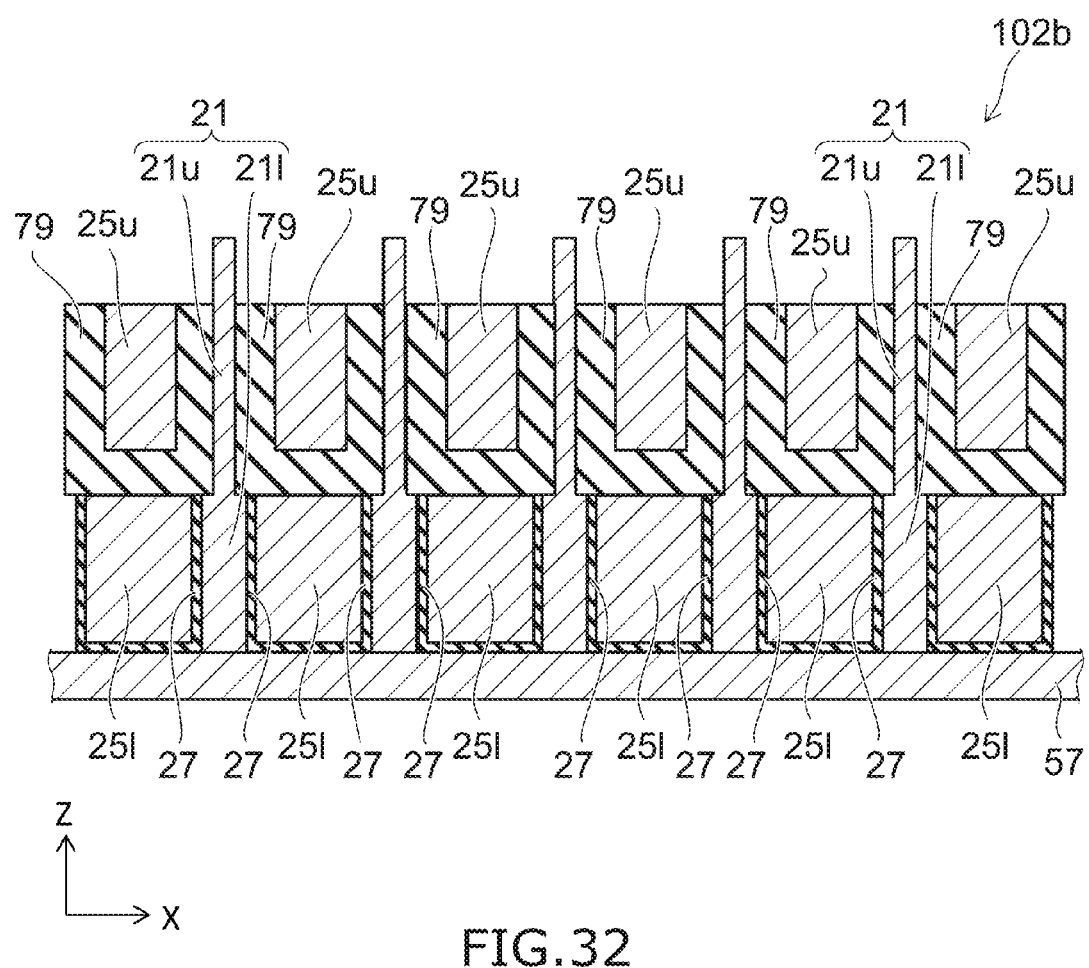
FIG. 32 is a schematic cross-sectional view showing an interconnect selection unit of an integrated circuit device according to a second modification of the twelfth embodiment.

FIG. 32 is a schematic cross-sectional view showing the interconnect selection unit of the integrated circuit device according to the modification.

As shown in FIG. 32, the integrated circuit device 102$b$ according to the modification differs from the integrated circuit device 102$a$ according to the first modification of the twelfth embodiment described above (referring to FIG. 31) in that the upper portion 21$u$ of the semiconductor member 21, i.e., the portion contacting the high dielectric constant film 79, is finer than the lower portion 21$l$ of the semiconductor member 21, i.e., the portion opposing the gate electrode 25$l$ of the lower level. Also, the gate electrode 25$u$ of the upper level is wider by the amount that the upper portion 21$u$ of the semiconductor member 21 is finer.

According to the modification, the distance between the upper portions 21$u$ of the semiconductor members 21 can be longer by setting the upper portions 21$u$ of the semiconductor members 21 to be finer. Thereby, the width, i.e., the length in the X-direction, becomes longer for the space surrounded on three sides with the high dielectric constant film 79 having the U-shaped cross-sectional configuration; and the gate electrode 25$u$ of the upper level is filled more easily. Therefore, in the modification, the formation of the gate electrode 25$u$ is easy. Otherwise, the configuration, the manufacturing method, and the effects of the modification are similar to those of the first modification of the twelfth embodiment described above.

First Test Example

A test example having the effects of the first embodiment described above will now be described.

Figure 33A:
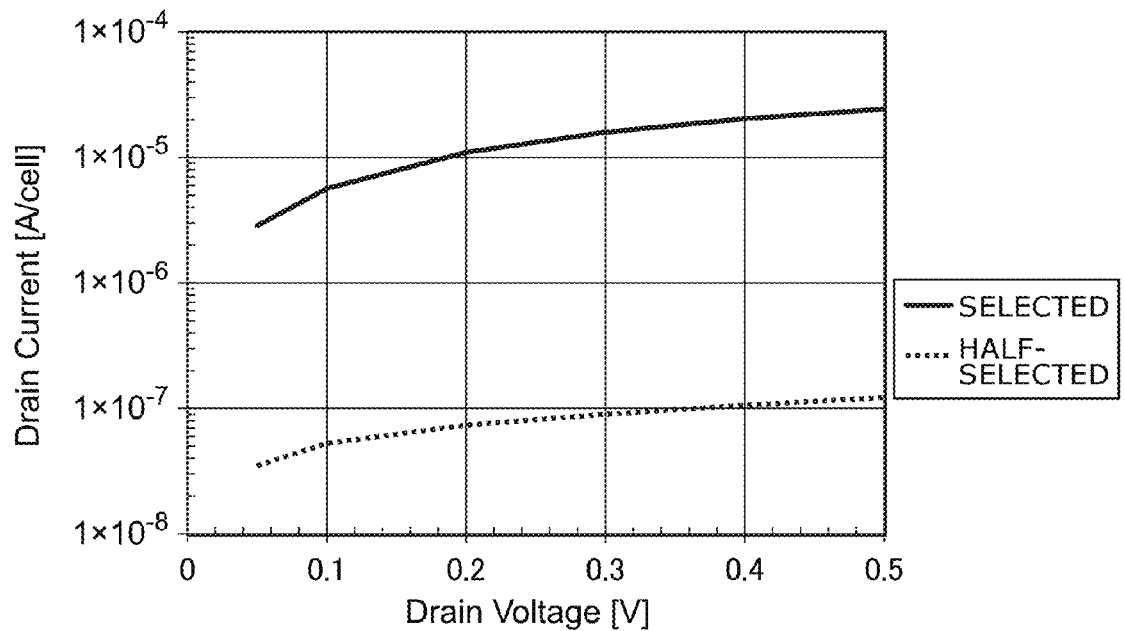
FIG. 33A is an example of a graph showing the current flowing in a selected semiconductor member and the current flowing in a half-selected semiconductor member in the integrated circuit device according to an example of the first embodiment, where the horizontal axis is the drain voltage, and the vertical axis is the drain current.
Figure 33:
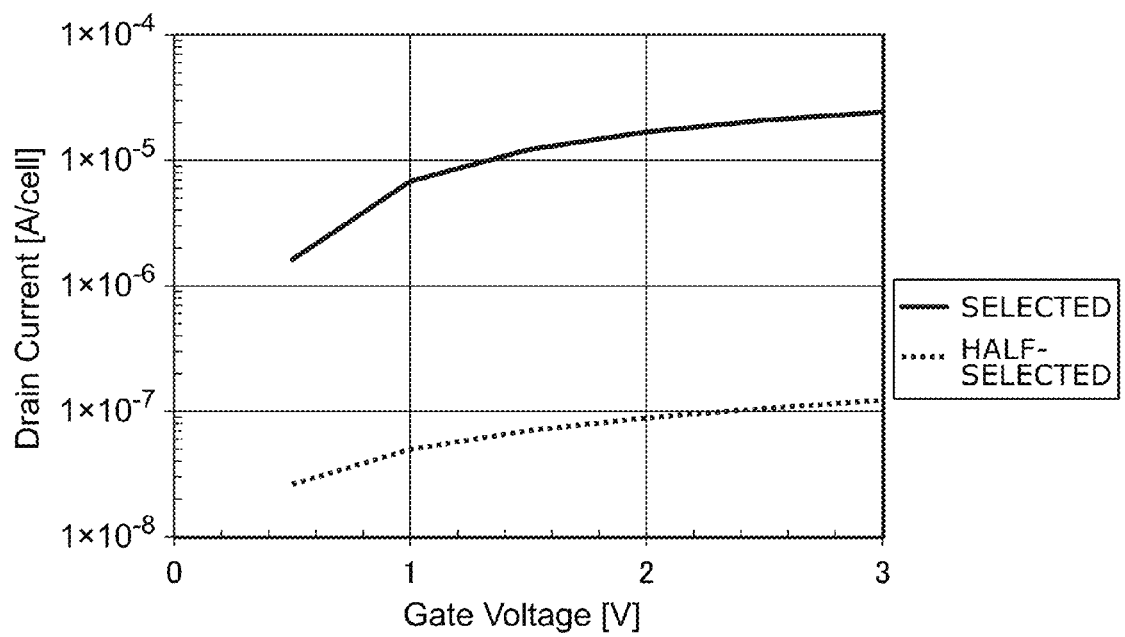
FIG. 33B is an example of a graph showing the current flowing in the selected semiconductor member and the current flowing in the half-selected semiconductor member of the integrated circuit device according to the example of the first embodiment, where the horizontal axis is a gate voltage, and the vertical axis is the drain current.

FIG. 33A is an example of a graph showing the current flowing in a selected semiconductor member (labeled "selected" in the drawing) and the current flowing in half-selected semiconductor member (labeled "half-selected" in the drawing) adjacent to the selected semiconductor member in the integrated circuit device according to an example of the first embodiment (referring to FIG. 1), where the horizontal axis is the drain voltage, and the vertical axis is the drain current.

FIG. 33B is an example of a graph showing the current flowing in the selected semiconductor member and the current flowing in the half-selected semiconductor member of the integrated circuit device according to the example of the first embodiment, where the horizontal axis is the gate voltage, and the vertical axis is the drain current.

FIG. 34A and FIG. 34B are examples of graphs of the electron concentration inside the semiconductor member. FIG. 34A shows the case where the ON potential is applied to the gate electrodes 25$a$ and 25$b$, the OFF potential is applied to the dummy electrodes 25$d$ and 25$e$, and the semiconductor member is switched to the ON state (selected); and FIG. 34B shows the case where the ON potential is applied to only the gate electrode 25$b$, the OFF potential is applied to the gate electrode 25$a$ and the dummy electrodes 25$d$ and 25$e$, and the semiconductor member is switched to the OFF state (half-selected).

The test example shown in FIG. 33A, FIG. 33B, FIG. 34A, and FIG. 34B was implemented by simulation. The "half-selected" semiconductor member corresponds to the semiconductor members 21$b$ and 21$c$ shown in FIG. 7. In other words, the "half-selected" semiconductor member is the semiconductor member for which the ON potential is applied to one of the gate electrodes disposed on the two sides of the semiconductor member and the OFF potential is applied to the other.

In the integrated circuit device according to the example of the first embodiment as shown in FIGS. 33A and 33B, the current flowing in the half-selected semiconductor member was about ($\frac{1}{100}$) times the current flowing in the selected semiconductor member; and a sufficiently high ON/OFF ratio could be realized. The current flowing in the completely-unselected semiconductor members for which the OFF potential was applied to both gate electrodes on the two sides was about $1 \times 10^{-13}$ [A/cell] and was sufficiently low.

Also, in the integrated circuit device according to the example of the first embodiment as shown in FIG. 34A and FIG. 34B, the portion of the selected semiconductor member where the electron concentration is not less than $1 \times 10^{19}$ cm$^{-3}$ existed continuously along the Z-direction. On the other hand, the portion of the half-selected semiconductor member where the electron concentration is not less than $1 \times 10^{18}$ cm$^{-3}$ was broken in the Z-direction and did not exist continuously along the Z-direction.

Second Test Example

A test example having the effects of the eleventh embodiment described above will now be described.

FIG. 35A is an example of a graph of the electron concentration inside a semiconductor member that is switched to the ON state in the example of the first embodiment (referring to FIG. 1). FIG. 35B is an example of a graph of the electron concentration inside a semiconductor member that is switched to the ON state in the example of the eleventh embodiment (referring to FIG. 27).

In the test examples shown in FIG. 35A and FIG. 35B, the electron concentration inside the semiconductor member was calculated by simulation for the case where the ON potential is applied to the gate electrodes 25$a$ and 25$b$, the OFF potential is applied to the dummy electrodes 25$d$ and 25$e$, and the semiconductor member is in the ON state (selected).

As shown in FIG. 35A and FIG. 35B, the portion where the electron concentration inside the semiconductor member in the ON state is $1 \cdot 10^{19}$ cm$^{-3}$ or more was wider in the integrated circuit device according to the example of the eleventh embodiment than in the integrated circuit device according to the example of the first embodiment. In other words, the bottleneck of the current was relaxed. Also, although the ON current flowing through the semiconductor member in the example of the first embodiment was 26.5 µA, the ON current flowing through the semiconductor member in the example of the eleventh embodiment was 31.2 µA and was increased 18%.

According to the embodiments described above, an integrated circuit device having good stability of operation can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Additionally, the embodiments described above can be combined mutually.

What is claimed is:

1. An integrated circuit device, comprising:
   a semiconductor substrate;
   a first semiconductor member and a second semiconductor member provided on the semiconductor substrate, the first semiconductor member and the second semiconductor member extending in a first direction intersecting an upper surface of the semiconductor substrate and being separated from each other in a second direction intersecting the first direction;
   a first electrode disposed between the first semiconductor member and the second semiconductor member, the first electrode extending in a third direction intersecting a plane including both the first direction and the second direction;
   a second electrode disposed between the semiconductor substrate and the first electrode, the second electrode extending in the third direction;
   a first memory element connected to an end portion of the first semiconductor member on a side opposite to the semiconductor substrate; and
   a second memory element connected to an end portion of the second semiconductor member on a side opposite to the semiconductor substrate,
   wherein each of the first semiconductor member and the second semiconductor member includes:
   a first portion of a first conductivity type;
   a second portion of a second conductivity type; and
   a third portion of the first conductivity type, and
   wherein the first portion, the second portion, and the third portion are arranged in this order along the first direction.

2. The integrated circuit device according to claim 1, further comprising:
   a third electrode disposed on a side opposite to the second semiconductor member as viewed from the first semiconductor member, the third electrode extending in the third direction; and
   a fourth electrode disposed between the semiconductor substrate and the third electrode, the fourth electrode extending in the third direction,
   the first electrode being longer than the second electrode in the first direction, and the fourth electrode being longer than the third electrode in the first direction.

3. The integrated circuit device according to claim 2, wherein the second direction is orthogonal to the first direction, and one portion of the first electrode and one portion of the fourth electrode overlap as viewed from the second direction.

4. The integrated circuit device according to claim 1, further comprising a third electrode disposed on a side opposite to the second semiconductor member as viewed from the first semiconductor member, the third electrode extending in the third direction,
   the first electrode being longer than the second electrode in the first direction,
   a distance between the semiconductor substrate and a lower end of the third electrode being shorter than a distance between the semiconductor substrate and a lower end of the first electrode, and
   a distance between the semiconductor substrate and an upper end of the third electrode being longer than the distance between the semiconductor substrate and the lower end of the first electrode.

5. The integrated circuit device according to claim 1, further comprising:
   an active area provided on the semiconductor substrate;
   a second insulating film provided on the active area;
   a third electrode provided on the second insulating film; and
   an element-separating insulating film provided between the first semiconductor member and the second semiconductor member and around the active area,
   a lower surface of the portion of the element-separating insulating film disposed between the first semiconductor member and the second semiconductor member being positioned further on the semiconductor substrate side than a position of a lower surface of the portion of the element-separating insulating film provided around the active area.

6. The integrated circuit device according to claim 1, wherein a first portion of the first semiconductor member opposing the first electrode is finer than a second portion of the first semiconductor member positioned lower than the second electrode.

7. The integrated circuit device according to claim 6, wherein a third portion of the first semiconductor member opposing the second electrode is finer than the second portion.

8. The integrated circuit device according to claim 6, wherein a third portion of the first semiconductor member opposing the second electrode is wider than the first portion.

9. The integrated circuit device according to claim 6, wherein a stepped portion is formed at a side surface of the first semiconductor member on the second semiconductor member side, and a stepped portion is not formed at a side surface of the first semiconductor member on a side opposite to the second semiconductor member.

10. The integrated circuit device according to claim 1, wherein
    configurations of the first electrode and the second electrode are wave-like configurations oscillating in the first direction while extending in the third direction, and
    the distance between the first electrode and the second electrode is substantially constant at any position in the third direction.

11. The integrated circuit device according to claim 10, further comprising:
    a third semiconductor member disposed on the third-direction side as viewed from the first semiconductor member, the third semiconductor member extending in the first direction; and
    a fourth semiconductor member disposed between the first semiconductor member and the third semiconductor member, the fourth semiconductor member extending in the first direction, a round trip period of the wave-like configurations of the first electrode and the second electrode in the third direction being equal to an arrangement period of the first semiconductor member, the fourth semiconductor member, and the third semiconductor member in the third direction.

12. The integrated circuit device according to claim 1, further comprising an insulating film provided between the first electrode and the second electrode, the insulating film generating a positive fixed charge at a vicinity of the first semiconductor member and the second semiconductor member.

13. The integrated circuit device according to claim 12, wherein the insulating film includes silicon and nitrogen.

14. The integrated circuit device according to claim 1, further comprising a high dielectric constant film provided between the first electrode and the second electrode, a dielectric constant of the high dielectric constant film being higher than a dielectric constant of silicon oxide.

15. The integrated circuit device according to claim 14, wherein the high dielectric constant film includes at least one type of material selected from the group consisting of aluminum oxide, hafnium oxide, lanthanum oxide, tantalum oxide, titanium oxide, tungsten oxide, silicon nitride, and silicon oxynitride.

16. The integrated circuit device according to claim 14, wherein the high dielectric constant film also is disposed between the first semiconductor member and the first electrode and between the second semiconductor member and the first electrode.

17. The integrated circuit device according to claim 16, further comprising a gate insulator film disposed between the first semiconductor member and the second electrode and between the second semiconductor member and the second electrode, a dielectric constant of the gate insulator film being lower than the dielectric constant of the high dielectric constant film, and the gate insulator film being thinner than the high dielectric constant film.

18. The integrated circuit device according to claim 16, wherein a distance between the semiconductor substrate and a first point of the high dielectric constant film most distal to the semiconductor substrate is longer than a distance between the semiconductor substrate and a second point of the first electrode most distal to the semiconductor substrate.

19. The integrated circuit device according to claim 16, wherein a distance between the semiconductor substrate and a first point of the high dielectric constant film most distal to the semiconductor substrate is not more than a distance between the semiconductor substrate and a second point of the first electrode most distal to the semiconductor substrate.

20. The integrated circuit device according to claim 16, wherein a portion of the first semiconductor member contacting the high dielectric constant film is finer than a portion of the first semiconductor member opposing the second electrode.

21. The integrated circuit device according to claim 1, further comprising a first interconnect connected to an end portion of the first semiconductor member on a side of the semiconductor substrate and an end portion of the second semiconductor member on a side of the semiconductor substrate, the first interconnect extending in the second direction.

22. The integrated circuit device according to claim 1, further comprising:
a second interconnect extending in the first direction and connected to the end portion of the first semiconductor member;
a third interconnect extending in the third direction and provided on the first electrode; and
a first variable resistance film interposed between the second interconnect and the third interconnect,
wherein the first memory element is formed of the second interconnect, the third interconnect, and the first variable resistance film.

23. The integrated circuit device according to claim 22, further comprising:
a fourth interconnect extending in the first direction and connected to the end portion of the second semiconductor member; and
a second variable resistance film interposed between the fourth interconnect and the third interconnect,
wherein the second memory element is formed of the third interconnect, the fourth interconnect, and the second variable resistance film.

* * * * *